(12) United States Patent
Bae et al.

(10) Patent No.: US 12,545,833 B2
(45) Date of Patent: Feb. 10, 2026

(54) ORGANIC COMPOUND, ORGANIC LIGHT EMITTING DIODE, AND ORGANIC LIGHT EMITTING DISPLAY DEVICE INCLUDING THE SAME

(71) Applicant: LG Display Co., Ltd., Seoul (KR)

(72) Inventors: Suk-Young Bae, Paju-si (KR); Ik-Rang Choe, Paju-si (KR); Jun-Yun Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 694 days.

(21) Appl. No.: 16/701,573

(22) Filed: Dec. 3, 2019

(65) Prior Publication Data
US 2020/0194674 A1    Jun. 18, 2020

(30) Foreign Application Priority Data
Dec. 14, 2018  (KR) .................. 10-2018-0161945

(51) Int. Cl.
*C09K 11/06* (2006.01)
*C07C 211/61* (2006.01)
(Continued)

(52) U.S. Cl.
CPC ............ *C09K 11/06* (2013.01); *C07C 211/61* (2013.01); *C07D 209/86* (2013.01);
(Continued)

(58) Field of Classification Search
CPC ..... C07C 13/62; C07C 211/60; C07C 211/61; C07C 2603/54; C07D 208/86;
(Continued)

(56) References Cited

U.S. PATENT DOCUMENTS

2004/0100190 A1* 5/2004 Kim .................. H01L 51/5012
313/504
2006/0040132 A1* 2/2006 Liao .................. H01L 51/5278
313/506

(Continued)

FOREIGN PATENT DOCUMENTS

CN      104829521 A    8/2015
CN      107880025 A    4/2018
(Continued)

OTHER PUBLICATIONS

Uoyama, H., Goushi, K., Shizu, K. et al. Highly efficient organic light-emitting diodes from delayed fluorescence. Nature 492, 234-238 (2012). (Year: 2012).*

(Continued)

*Primary Examiner* — Elizabeth M. Dahlburg
(74) *Attorney, Agent, or Firm* — Morgan, Lewis & Bockius LLP

(57) ABSTRACT

The present disclosure provides an organic compound of following Formula, and an organic light emitting diode and an organic light emitting display device including the organic emitting compound.

(Continued)

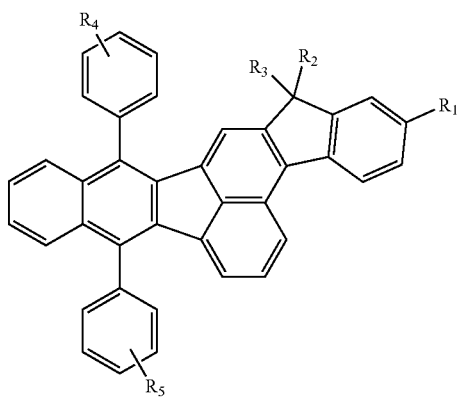

11 Claims, 4 Drawing Sheets

(51) Int. Cl.
    *C07D 209/86* (2006.01)
    *H10K 50/11* (2023.01)
    *H10K 85/60* (2023.01)
    *H10K 101/20* (2023.01)
    *H10K 50/13* (2023.01)
    *H10K 50/18* (2023.01)
    *H10K 101/10* (2023.01)

(52) U.S. Cl.
    CPC ......... *H10K 85/633* (2023.02); *H10K 85/654* (2023.02); *H10K 85/6572* (2023.02); *H10K 85/6574* (2023.02); *H10K 85/6576* (2023.02); *C07C 2603/54* (2017.05); *C09K 2211/1007* (2013.01); *C09K 2211/1011* (2013.01); *H10K 50/11* (2023.02); *H10K 50/13* (2023.02); *H10K 50/18* (2023.02); *H10K 50/181* (2023.02); *H10K 85/624* (2023.02); *H10K 2101/10* (2023.02); *H10K 2101/20* (2023.02)

(58) Field of Classification Search
    CPC . C07D 209/82; C07D 209/88; H01L 51/0056; H01L 51/006; H01L 51/0072; H10K 50/11; H10K 50/12; H10K 50/13; H10K 50/18; H10K 85/624; H10K 85/625; H10K 85/633; H10K 85/654; H10K 85/6572; H10K 85/6574; H10K 85/6576; H10K 2101/10; H10K 2101/20; H10K 50/181; C09K 11/06; C09K 2211/1007; C09K 2211/1011; C09K 2211/1014; C09K 2211/1029
    See application file for complete search history.

(56) References Cited

U.S. PATENT DOCUMENTS

| | | | |
|---|---|---|---|
| 2009/0302758 A1* | 12/2009 | Saitoh | C09K 11/06 |
| | | | 313/506 |
| 2010/0127618 A1 | 5/2010 | Ohrui et al. | |
| 2010/0237334 A1* | 9/2010 | Ma | C07D 307/91 |
| | | | 546/281.1 |
| 2017/0244049 A1 | 8/2017 | Aspuru-Guzik et al. | |
| 2019/0229271 A1 | 7/2019 | Lee et al. | |
| 2019/0337872 A1* | 11/2019 | Saito | H01L 51/0055 |

FOREIGN PATENT DOCUMENTS

| | | |
|---|---|---|
| CN | 108383734 A | 8/2018 |
| JP | 2012-148987 A | 8/2012 |
| KR | 10-2009-0122922 A | 12/2009 |
| KR | 10-2011-0057400 A | 6/2011 |
| KR | 10-2011-0077831 A | 7/2011 |
| KR | 101503796 B1 | 3/2015 |
| KR | 10-2017-0005853 A | 1/2017 |
| KR | 10-2018-0008291 A | 1/2018 |
| WO | 2008/059713 A1 | 5/2008 |
| WO | 2018/088472 A1 | 5/2018 |

OTHER PUBLICATIONS

Office Action issued in corresponding Chinese Patent Application No. 201911188193.7 dated Jul. 20, 2022.

* cited by examiner

100

D

ORGANIC COMPOUND, ORGANIC LIGHT EMITTING DIODE, AND ORGANIC LIGHT EMITTING DISPLAY DEVICE INCLUDING THE SAME

CROSS-REFERENCE TO RELATED APPLICATIONS

The present application claims the benefit of Korean Patent Application No. 10-2018-0161945 filed in the Republic of Korea on Dec. 14, 2018, which is hereby incorporated by reference in its entirety.

BACKGROUND

Technical Field

The present disclosure relates to an organic compound, and more particularly, to an organic compound having high emitting efficiency and color purity and an organic light emitting diode and an organic light emitting display device including the same.

Discussion of the Related Art

Recently, requirement for flat panel display devices having small occupied area is increased. Among the flat panel display devices, a technology of an organic light emitting display device including an organic light emitting diode (OLED) is rapidly developed.

The OLED emits light by injecting electrons from a cathode as an electron injection electrode and holes from an anode as a hole injection electrode into an emitting layer, combining the electrons with the holes, generating an exciton, and transforming the exciton from an excited state to a ground state. A flexible transparent substrate, for example, a plastic substrate, can be used as a base substrate where elements are formed. In addition, the emitting diode can be operated at a voltage (e.g., 10V or below) lower than a voltage required to operate other display devices and has low power consumption. Moreover, the light from the emitting diode has excellent color purity.

The hole from the anode and the electron are combined in an emitting material layer (EML) to generate an exciton, and the exciton is transformed from an excited state to a ground state such that the light is emitted from the organic emitting layer.

An emitting material for the EML may be classified into a fluorescent material (compound), a phosphorescent material and a delayed fluorescent material.

In the fluorescent material, since only singlet exciton is involved in emission, the fluorescent material provides low emitting efficiency (quantum efficiency).

In the phosphorescent material, since not only singlet exciton but also triplet exciton is involved in emission, the phosphorescent material provides high emitting efficiency. However, since the phosphorescent material requires rare metal atom, e.g., Ir, the phosphorescent material is very expensive. In addition, there is a limitation of blue emission.

The delayed fluorescent material is configured such that a triplet exciton is activated by an electric field or heat and is thus up-converted into a singlet exciton, and accordingly, both of the triplet exciton and the singlet exciton are involved in light emission. However, since the delayed fluorescent material provides wide full width at a half maximum (FWHM), the color purity of the display device using the delayed fluorescent material as the emitting material is decreased.

SUMMARY

The embodiments of the present disclosure are directed to an organic compound and an OLED and an organic light emitting display device including the same that substantially obviate one or more of the problems associated with the limitations and disadvantages of the related conventional art.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, provided is an organic compound of Formula 1:

[Formula 1]

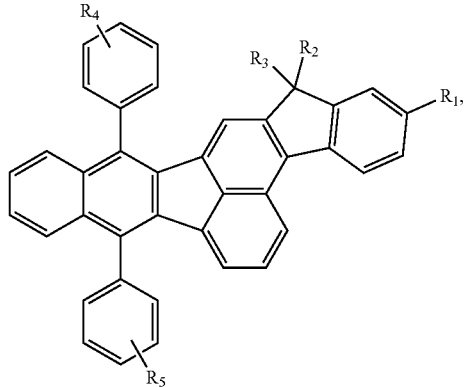

wherein R1 in Formula 1 is one of Formula 2-1 and Formula 2-2,

[Formula 2-1]

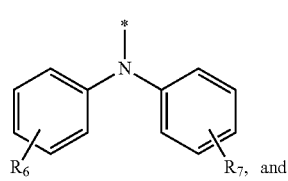

[Formula 2-2]

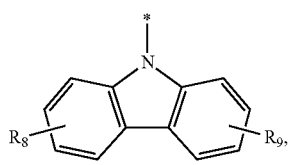

and wherein each of $R_2$ to $R_9$ is independently selected from the group consisting of hydrogen, C1 to C20 alkyl group, C6 to C30 aryl group and C5 to C30 heteroaryl group.

Another aspect of the present disclosure is an organic light emitting diode comprising: a first electrode; a second electrode facing the first electrode; and a first emitting material layer positioned between the first and second electrodes and including an organic compound, wherein the organic compound is represent by Formula 1:

[Formula 1]

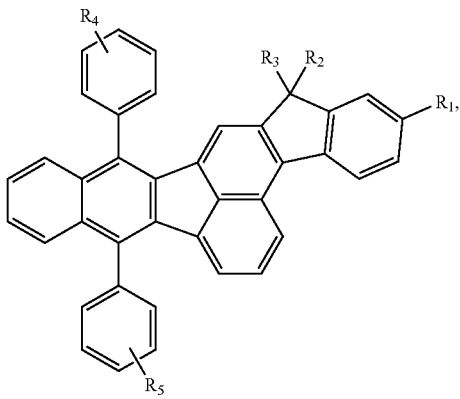

wherein R1 in Formula 1 is one of Formula 2-1 and Formula 2-2,

[Formula 2-1]

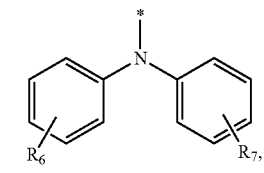

and

[Formula 2-2]

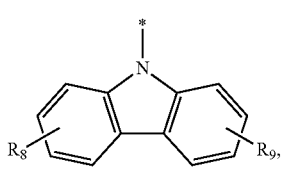

and wherein each of $R_2$ to $R_9$ is independently selected from the group consisting of hydrogen, C1 to C20 alkyl group, C6 to C30 aryl group and C5 to C30 heteroaryl group.

Another aspect of the present disclosure is an organic light emitting display device comprising: a substrate; an organic light emitting diode on the substrate, the organic light emitting diode including: a first electrode; a second electrode facing the first electrode; and a first emitting material layer positioned between the first and second electrodes and including an organic compound, wherein the organic compound is represent by Formula 1:

[Formula 1]

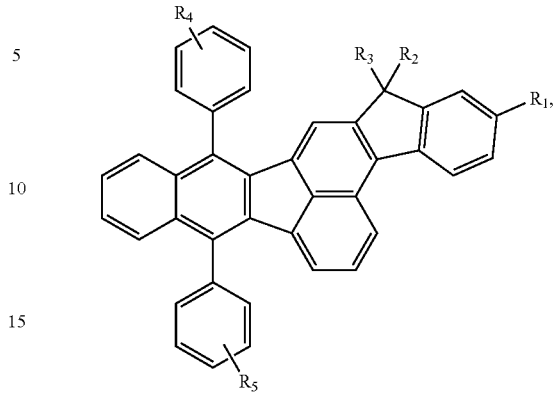

wherein R1 in Formula 1 is one of Formula 2-1 and Formula 2-2,

[Formula 2-1]

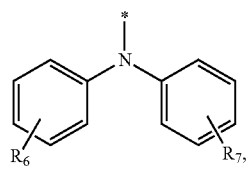

and

[Formula 2-2]

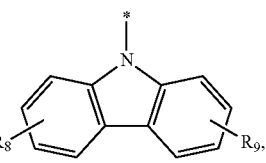

and wherein each of R2 to R9 is independently selected from the group consisting of hydrogen, C1 to C20 alkyl group, C6 to C30 aryl group and C5 to C30 heteroaryl group.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain the principles of the present disclosure.

DETAILED DESCRIPTION

Reference will now be made in detail to embodiments of the present disclosure, examples of which are illustrated in the accompanying drawings.

Figure 1:
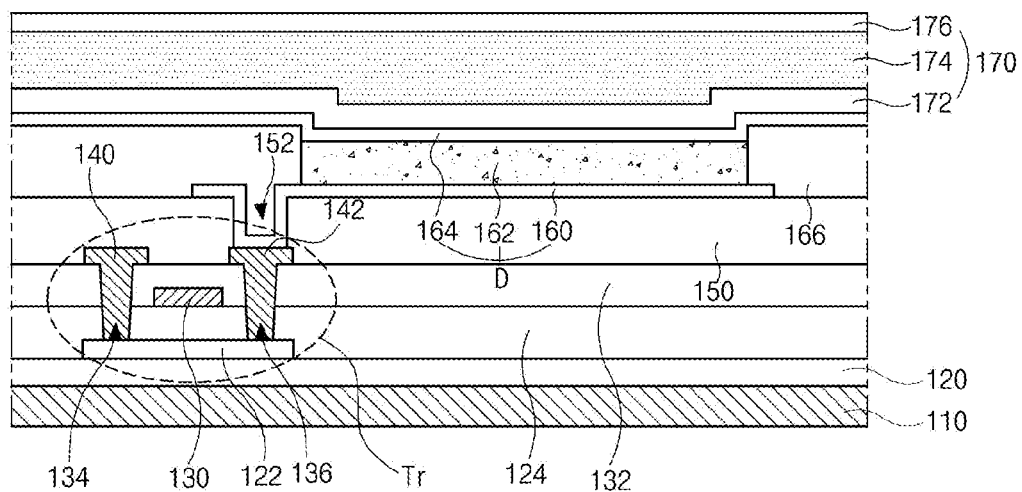
FIG. 1 is a schematic cross-sectional view of an organic light emitting display device of the present disclosure.

FIG. 1 is a schematic cross-sectional view of an organic light emitting display device of the present disclosure.

As shown in FIG. 1, the organic light emitting display device 100 includes a substrate 110, a TFT Tr and an OLED D connected to the TFT Tr.

The substrate 110 may be a glass substrate or a plastic substrate. For example, the substrate 110 may be a polyimide substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 1, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element.

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel region. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the OLED device 100 is operated in a top-emission type, a reflection electrode or a reflection layer may be formed under the first electrode 160. For example, the reflection electrode or the reflection layer may be formed of aluminum-palladium-copper (APC) alloy.

A bank layer 166 is formed on the passivation layer 150 to cover an edge of the first electrode 160. Namely, the bank layer 166 is positioned at a boundary of the pixel region and exposes a center of the first electrode 160 in the pixel region.

An organic emitting layer 162 is formed on the first electrode 160. The organic emitting layer 162 includes an organic compound of the present disclosure. The organic compound may be used as a dopant, and the organic emitting layer 162 may further include a host. For example, the dopant may be doped with a ratio of approximately 1 to 30 wt % with respect to the host. In addition, the organic emitting layer 162 may further include a delayed fluorescent compound as another dopant. In this instance, a summation of the organic emitting compound and the delayed fluorescent compound may have a range of approximately 1 to 50 wt % with respect to the host. The organic emitting layer 162 emits green light.

When the organic light emitting display device 100 includes a red pixel region, a green pixel region and a blue pixel region, the organic emitting layer 162 may includes a red emitting pattern, a green emitting pattern and a blue emitting pattern. The organic compound of the present disclosure is included in the organic emitting layer 162 in the green pixel region, i.e., the green emitting pattern.

The organic emitting layer 162 may have a single-layered structure of an emitting material layer including the organic emitting compound. To increase an emitting efficiency of the OLED device, the organic emitting layer 162 may have a multi-layered structure.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg) or Al—Mg alloy.

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

A polarization plate (not shown) for reducing an ambient light reflection may be disposed over the top-emission type OLED D. For example, the polarization plate may be a circular polarization plate.

In addition, a cover window (not shown) may be attached to the encapsulation film 170 or the polarization plate. In this instance, the substrate 110 and the cover window have a flexible property such that a flexible display device may be provided.

Figure 2:
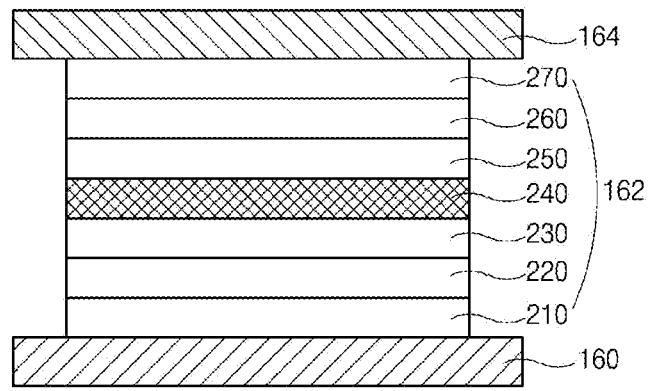
FIG. 2 is a schematic-cross sectional view of an OLED according to a first embodiment of the present disclosure.

FIG. 2 is a schematic-cross sectional view of an OLED according to a first embodiment of the present disclosure.

As shown in FIG. 2, the OLED D includes the first and second electrodes 160 and 164, which face each other, and the organic emitting layer 162 therebetween. The organic emitting layer 162 includes an emitting material layer (EML) 240 between the first and second electrodes 160 and 164, a hole transporting layer (HTL) 220 between the first electrode 160 and the EML 240 and an electron transporting layer (ETL) 260 between the second electrode 164 and the EML 240.

In addition, the organic emitting layer 162 may further include a hole injection layer (HIL) 210 between the first electrode 160 and the HTL 220 and an electron injection layer (EIL) 270 between the second electrode 164 and the ETL 260.

Moreover, the organic emitting layer 162 may further include an electron blocking layer (EBL) 230 between the HTL 220 and the EML 240 and a hole blocking layer (HBL) 250 between the EML 240 and the ETL 260.

The organic emitting layer 162, preferably the EML 240 includes an organic compound of Formula 1. $R_1$ in Formula 1 is one of Formula 2-1 and Formula 2-2.

[Formula 1]

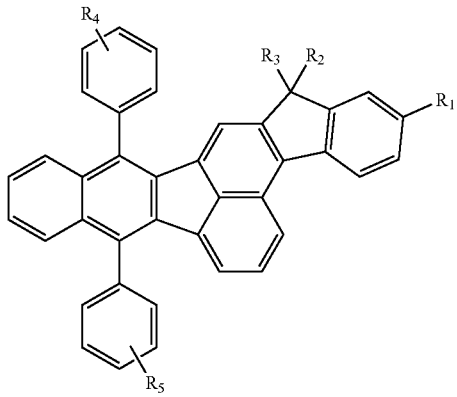

[Formula 2-1]

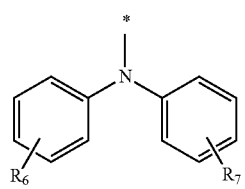

[Formula 2-2]

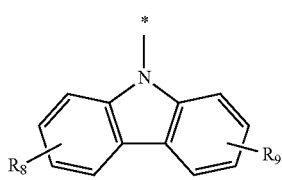

In Formulas 1, 2-1 and 2-2, each of $R_2$ to $R_9$ is independently selected from the group consisting of hydrogen, C1 to C20 alkyl group, C6 to C30 aryl group and C5 to C30 heteroaryl group. For example, each of $R_2$ and $R_3$ may be independently selected from the group consisting of methyl and phenyl, and each of $R_4$ to $R_7$ may be independently selected from the group consisting of hydrogen, methyl and phenyl. Each of $R_8$ and $R_9$ may be independently selected from the group consisting of hydrogen, methyl and carbazolyl.

Namely, the organic compound of the present disclosure includes a benzoindenofluoranthene core and an aryl amine moiety or a carbazole moiety bonded (connected) to the benzoindenofluoranthene core.

The organic compound has a fluorescent emission property and narrow full width at half maximum (FWHM) and high emitting efficiency.

For example, the organic compound may be selected from materials in Formula 3. [Formula 3]

1-1
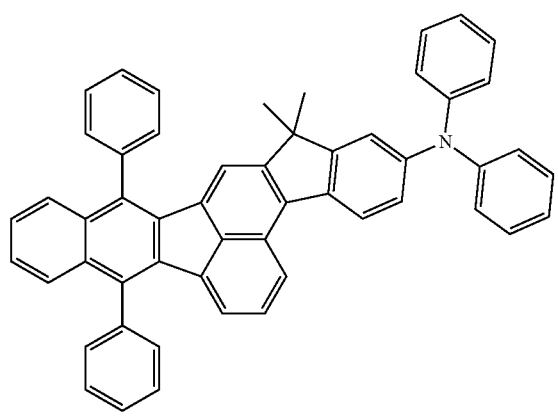
1-2
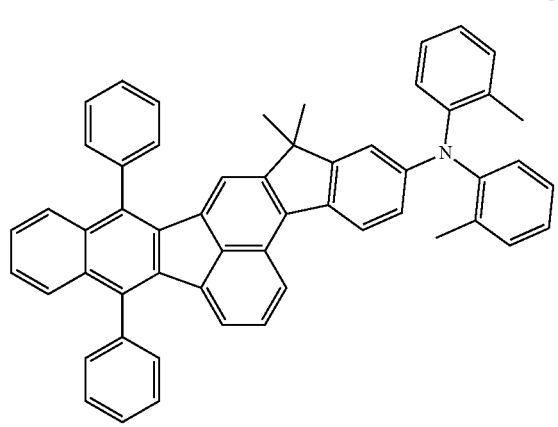
1-3
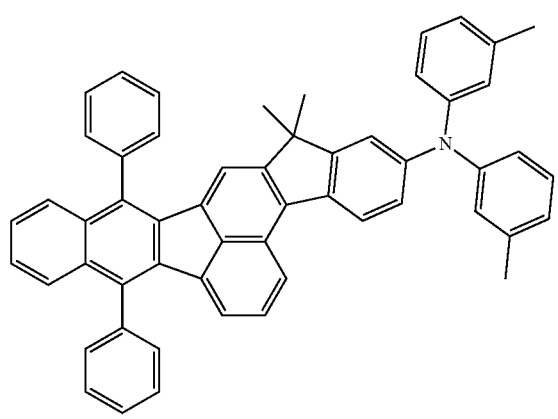
1-4
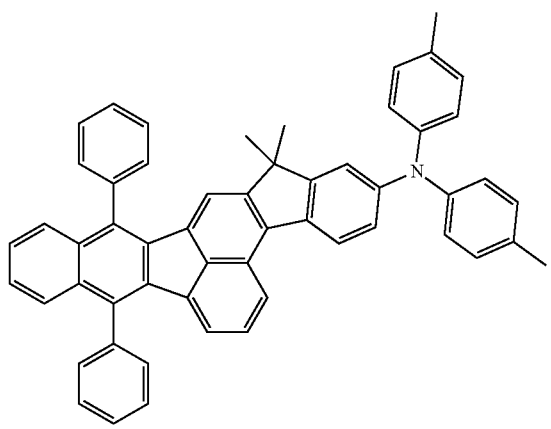
1-5
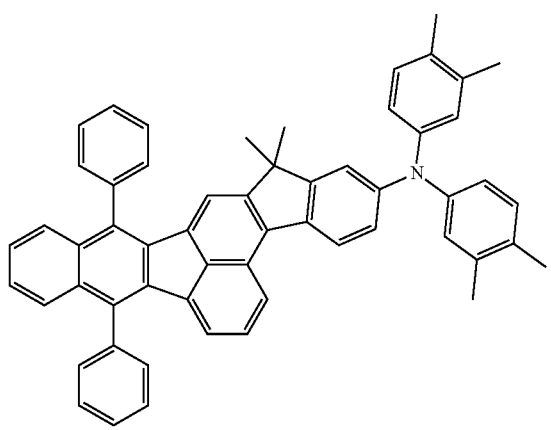
1-6
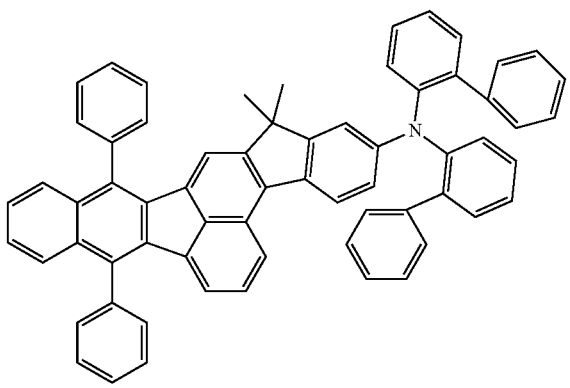

-continued
1-7
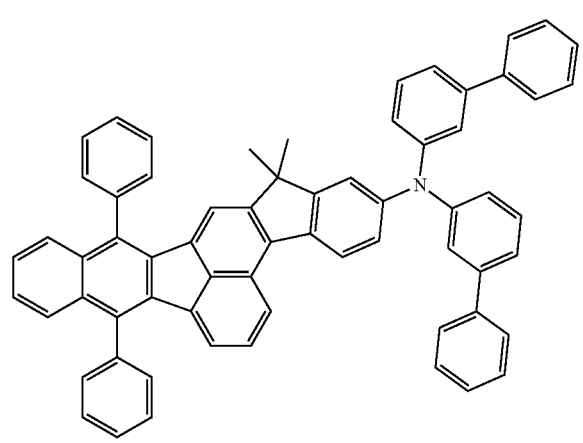
1-8
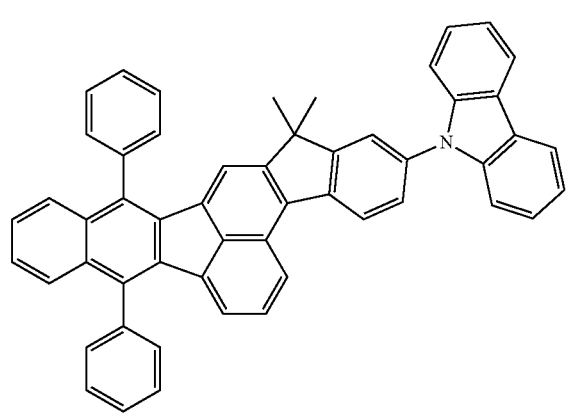
1-9
1-10
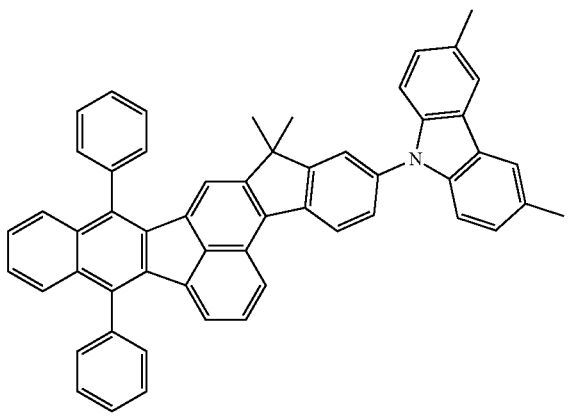
1-11
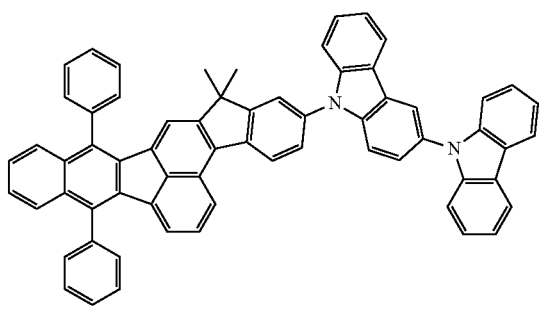
1-12
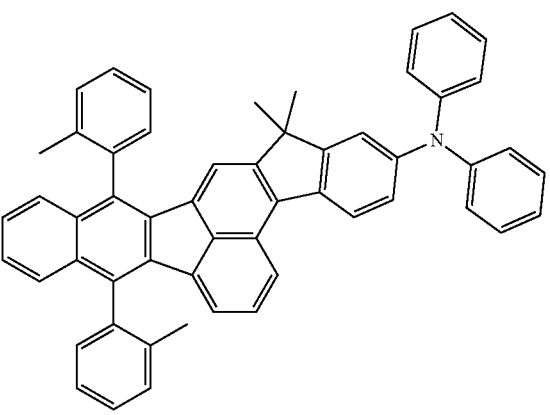
1-13
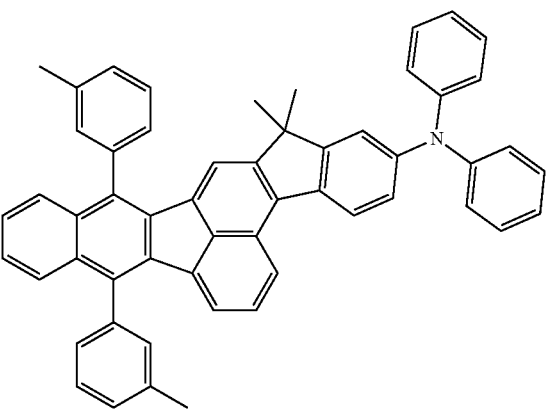

1-14
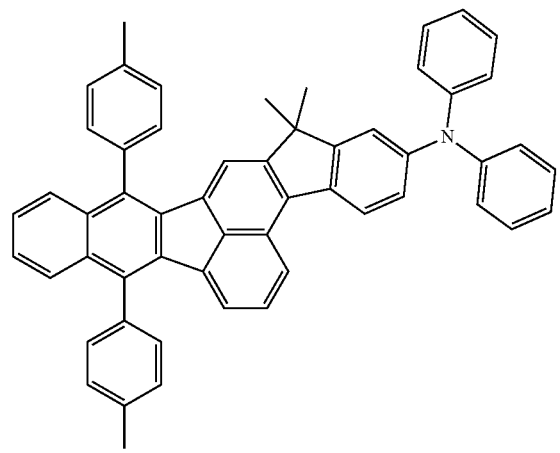
1-17
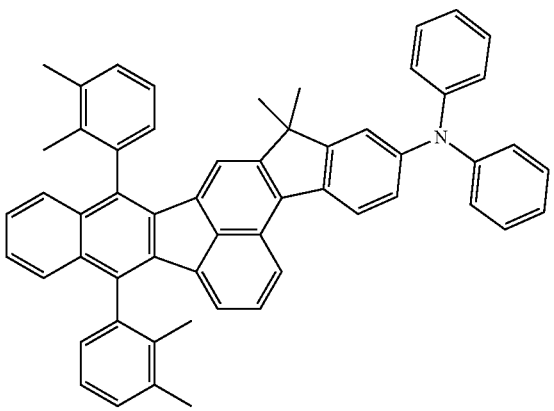
1-15
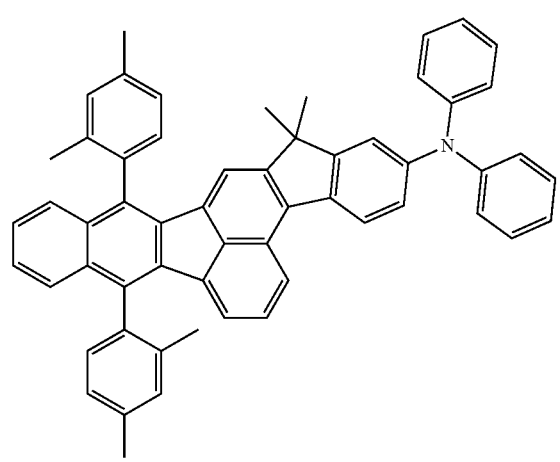
1-18
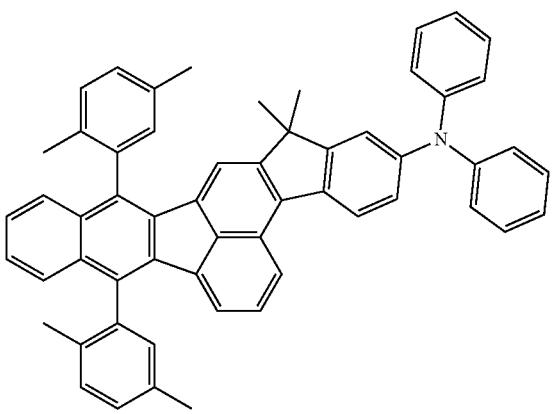
1-16
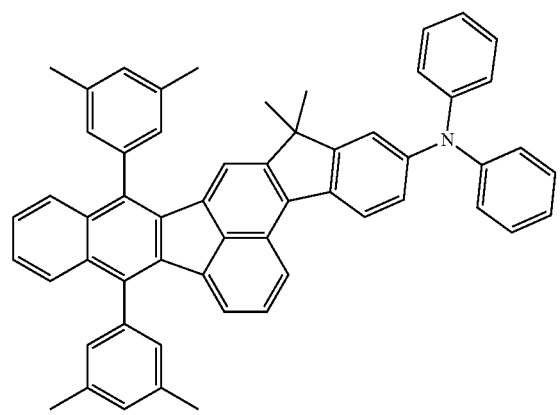
1-19
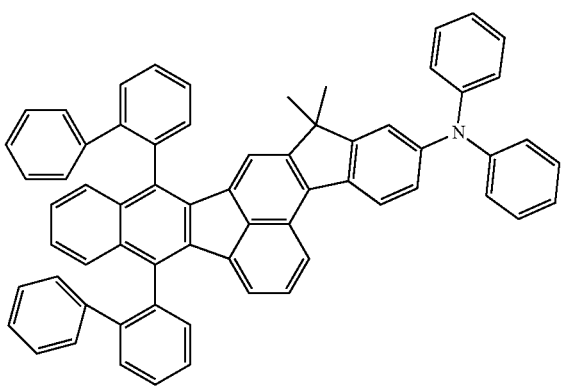

1-20
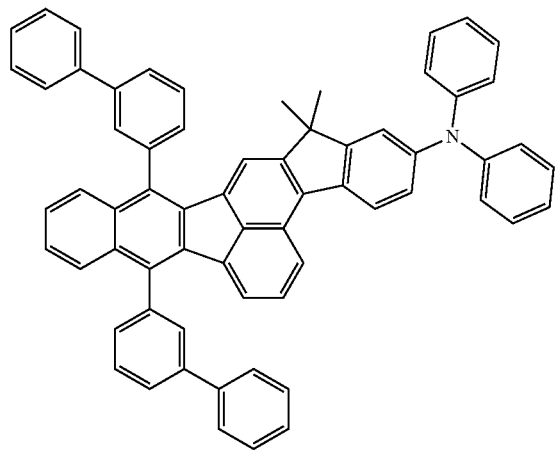
1-21
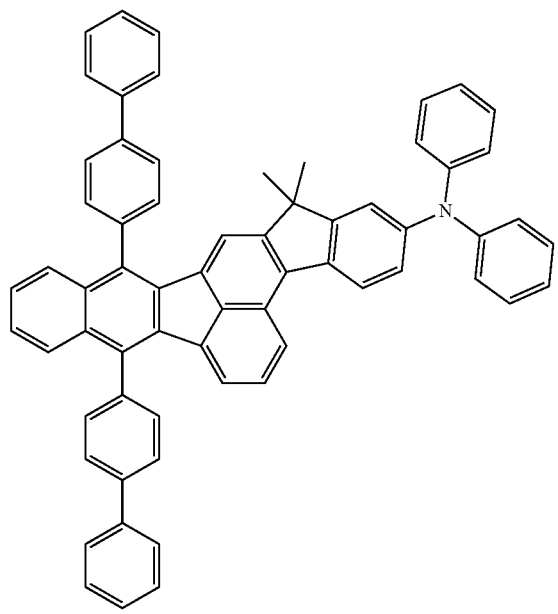
1-22
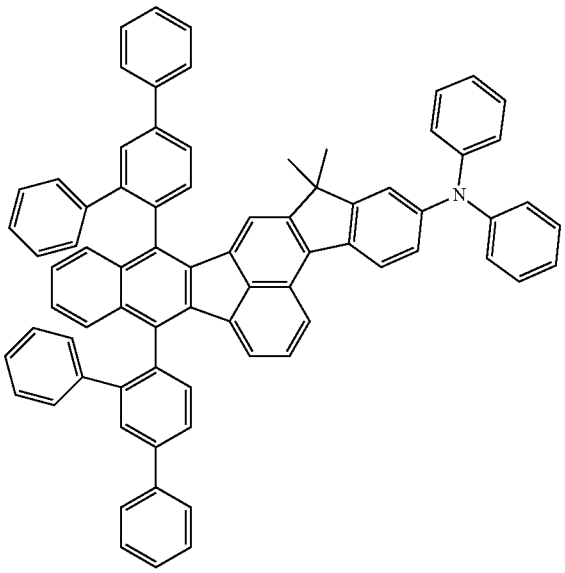
1-23
1-24
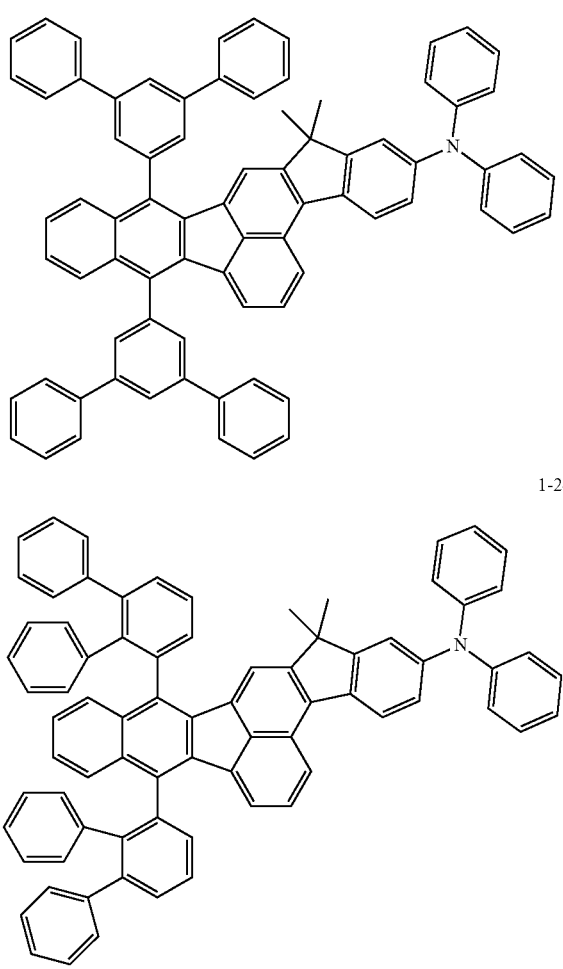

1-25
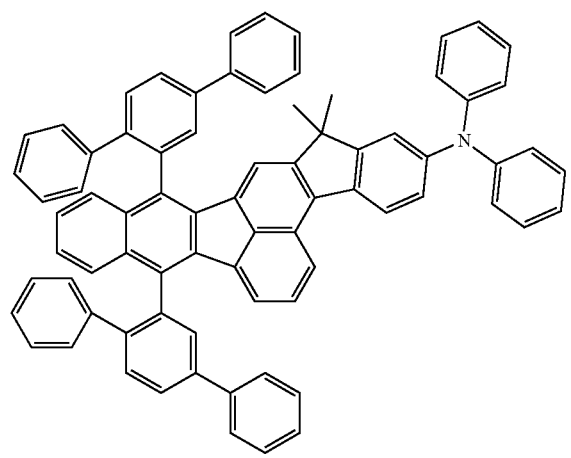
2-3
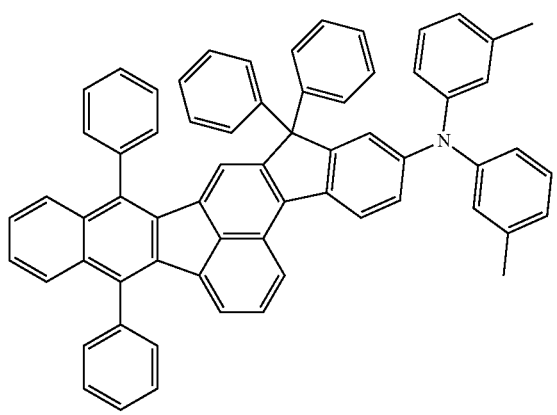
2-1
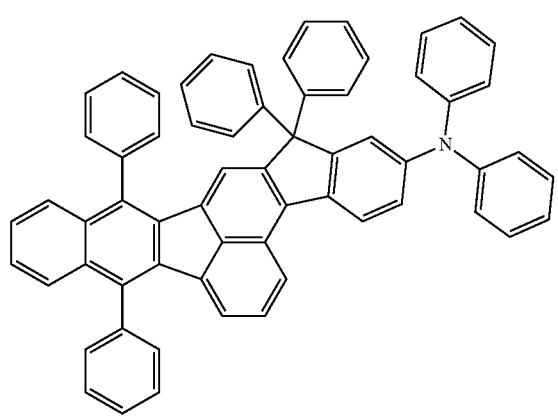
2-4
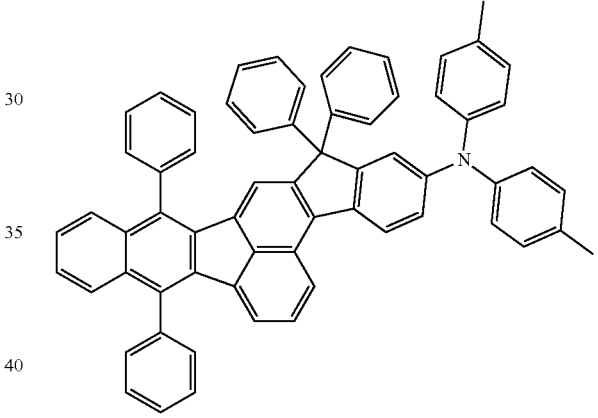
2-2
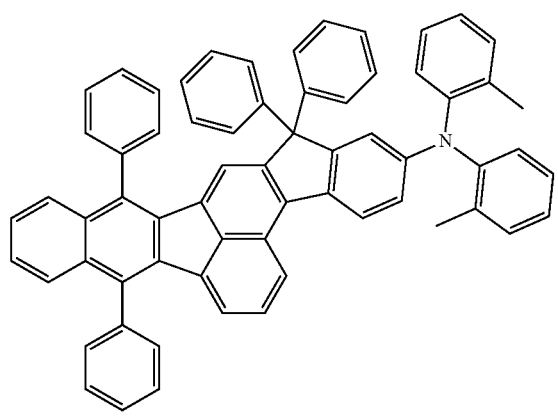
2-5
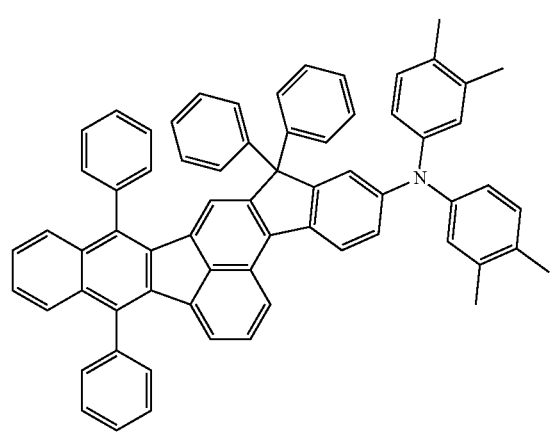

2-6
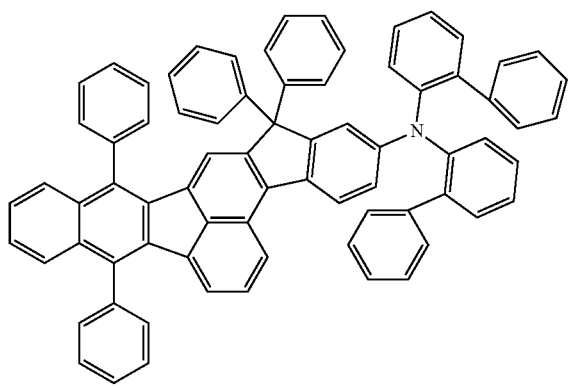
2-7
2-8
2-9
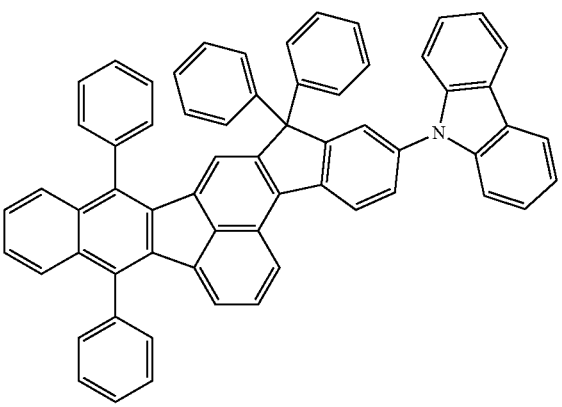
2-10
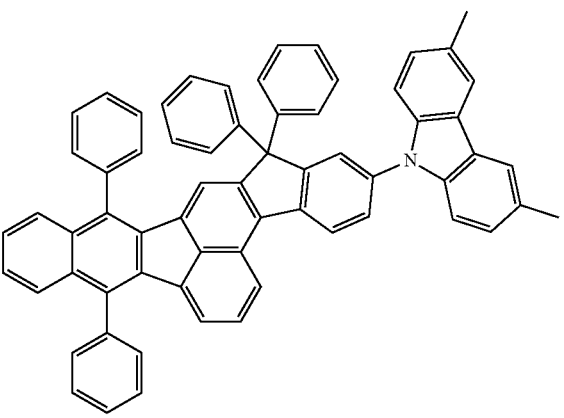
2-11
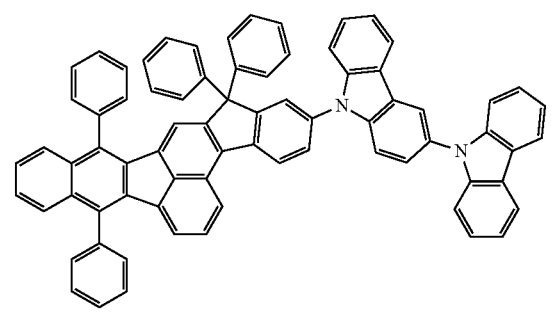
2-12
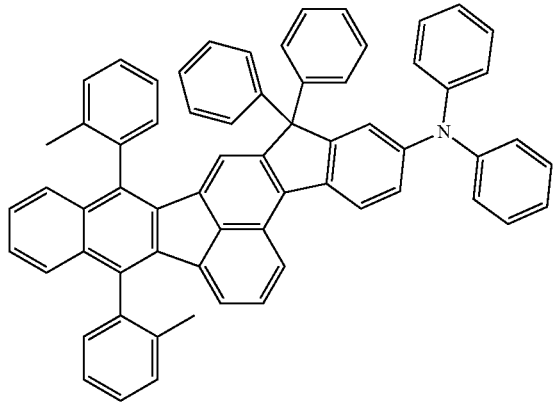

2-13
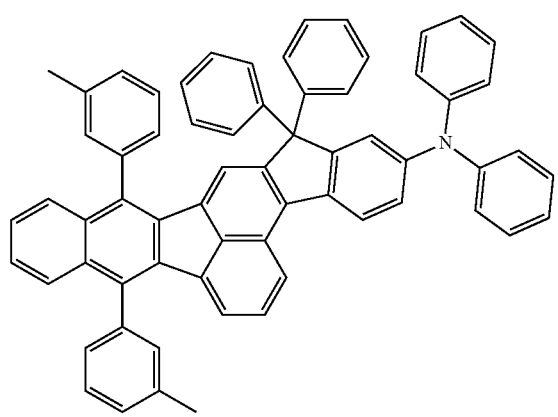
2-14
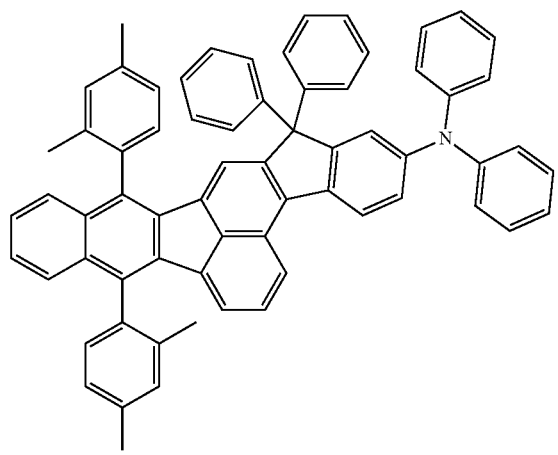
2-15
2-16
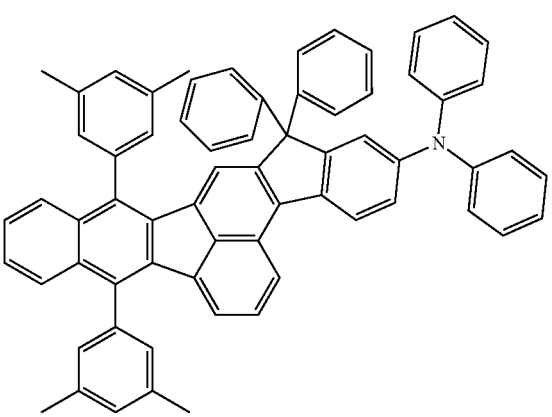
2-17
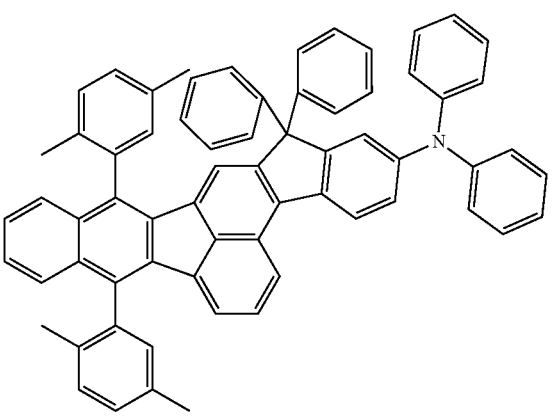
2-18

2-19
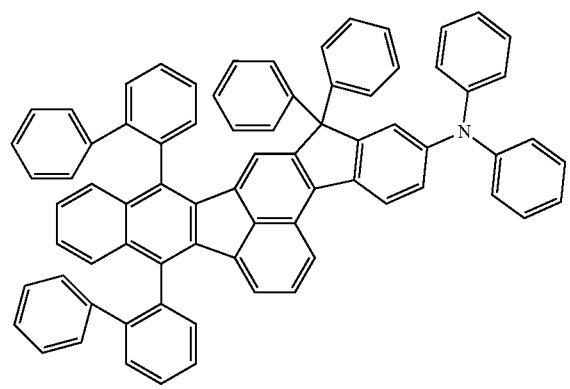
2-20
2-22
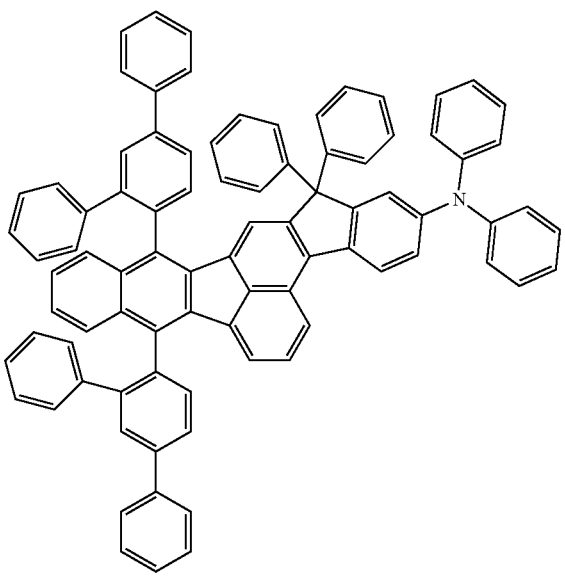
2-21
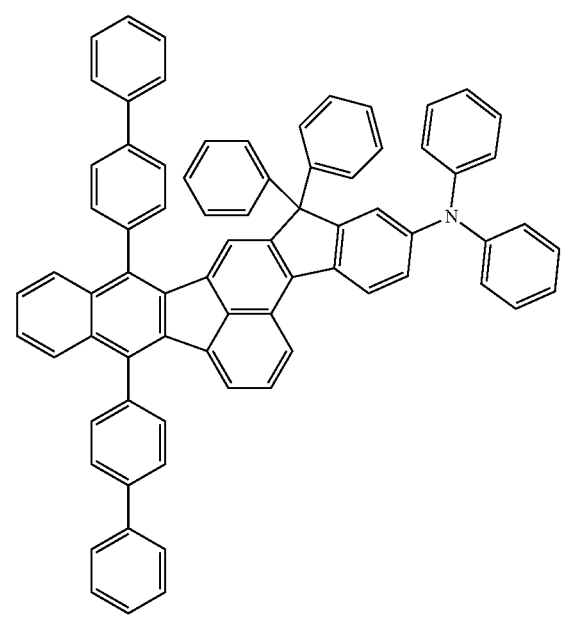
2-23
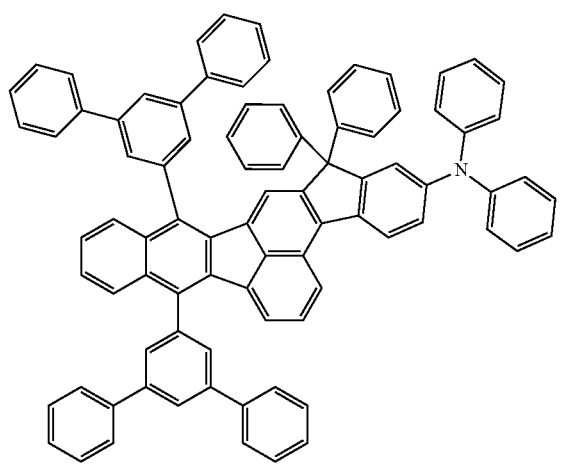
2-24

-continued 2-25

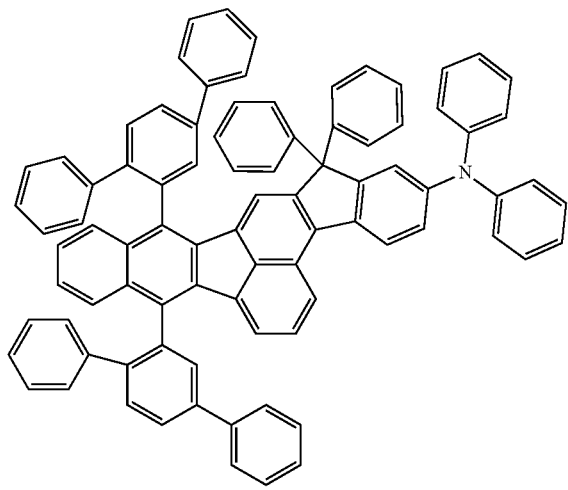

Synthesis of Organic Emitting Compounds

1. Synthesis of Compound 1-1

(1) Compound A-1

[Reaction Formula 1-1]

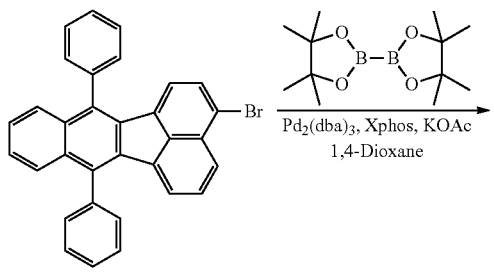

A-1

3-bromo-7,12-diphenylbenzo[k]fluoranthene (10.0 g, 20.69 mmol), bis(pinacolato)diborane (15.76 g, 62.06 mmol), $Pd_2(dba)_3$ (0.57 g, 0.62 mmol), XPhos (0.59 g, 1.24 mmol) and KOAc (7.11 g, 72.40 mmol) were put into the 2-neck flask (500 ml) and dissolved in 1,4-dioxane (300 ml). The mixture was refluxed and stirred for 12 hrs. After completion of reaction, the mixture was columned using hexane and ethyl acetate (volume ratio=10:1) such that compound A-1 was obtained. (5.90 g, yield: 53.77%)

(2) Compound A-2

[Reaction Formula 1-2]

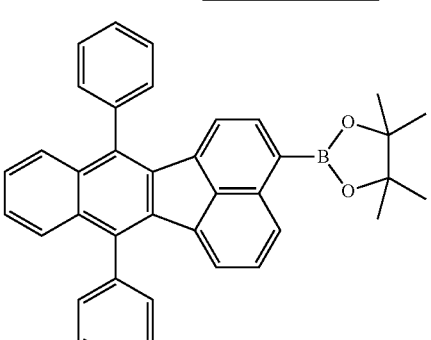

+

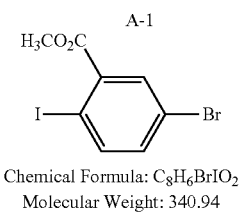

Chemical Formula: $C_8H_6BrIO_2$
Molecular Weight: 340.94

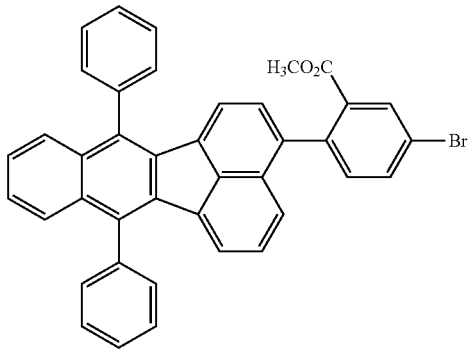

A-2

The compound A-1 (4.05 g, 7.63 mmol), methyl 5-bromo-2-iodobenzoate (3.12 g, 9.16 mmol), $K_2CO_3$ (5.28 g, 38.17 mmol) and $Pd(PPh_3)_4$ (0.26 g, 0.23 mmol) were put into the 2-neck flask (500 ml) and dissolved in the solvent (200 ml) of tetrahydrofuran (THF) and water (volume ratio=3:1). The mixture was refluxed and stirred for 12 hrs. After completion of reaction, the mixture was columned using methylenechloride (MC) and hexane (volume ratio=3:7) such that compound A-2 was obtained. (2.90 g, yield: 61.51%)

(3) Compound A-3

[Reaction Formula 1-3]

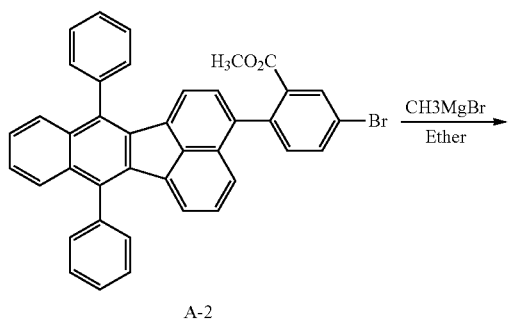

A-2

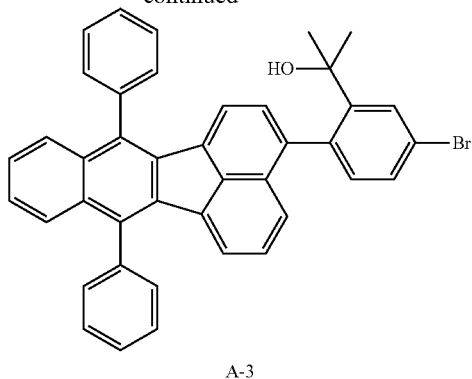

A-3

In the 2-neck flask (250 ml), the compound A-2 (2.90 g, 4.70 mmol) was dissolved in ether (70 ml) and cooled into the temperature of 0° C. CH₃MgBr (3M, 1.68 g, 14.09 mmol) was added into the solution, and the mixture was slowly heated into the room temperature. After completion of reaction, the mixture was filtered using water such that compound A-3 was obtained. (2.80 g, yield: 96.14%)

(4) Compound A-4

[Reaction Formula 1-4]

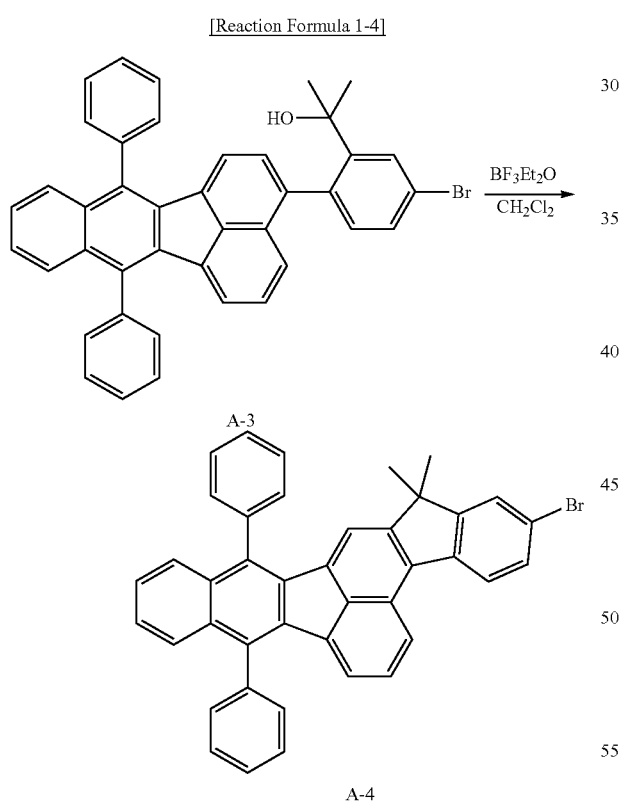

In the 2-neck flask (250 ml), the compound A-3 (3.00 g, 4.86 mmol) was dissolved in MC (70 ml) and cooled into the temperature of 0° C. BF₃Et₂O (1.03 g, 7.29 mmol) was added into the solution, and the mixture was slowly heated into the room temperature. The mixture was stirred under the room temperature for 6 hrs. After completion of reaction, the mixture was columned using MC and hexane (volume ratio=3:7) such that compound A-4 was obtained. (2.80 g, yield: 96.14%)

(5) Compound 1-1

[Reaction Formula 1-3]

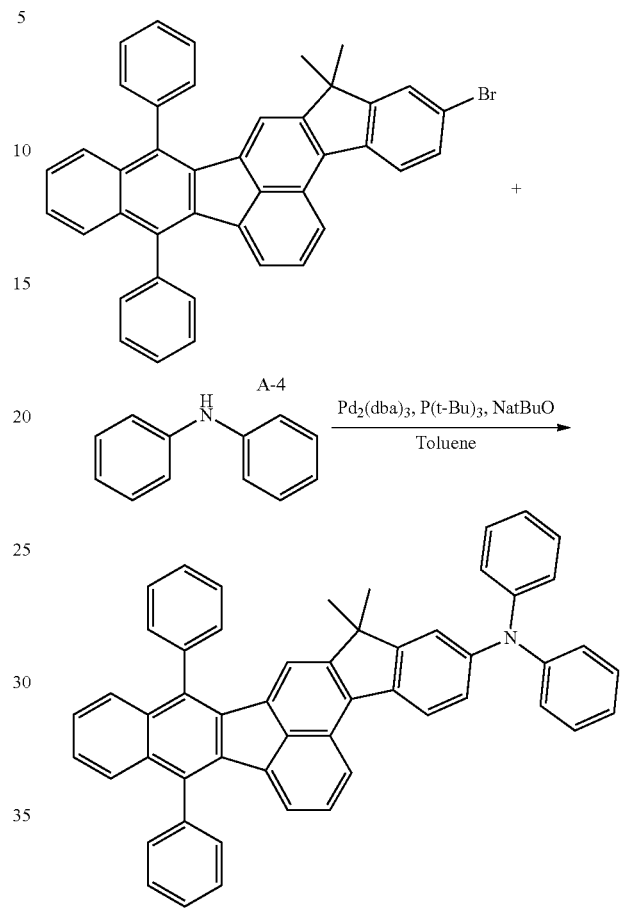

In the 2-neck flask (250 ml), the compound A-4 (1.60 g, 2.67 mmol), diphenylamine (0.54 g, 3.20 mmol), Pd₂(dba)₃ (0.07 g, 0.08 mmol), P(t-Bu)₃ (0.02 g, 0.08 mmol) and NatBuO (0.77 g, 8.01 mmol) was dissolved in toluene (100 ml). The mixture was stirred for 12 hrs. After completion of reaction, the mixture was columned using MC and hexane (volume ratio=3:7) such that compound 1-1 was obtained. (1.5 g, yield: 81.71%)

2. Synthesis of Compound 1-2

[Reaction Formula 2]

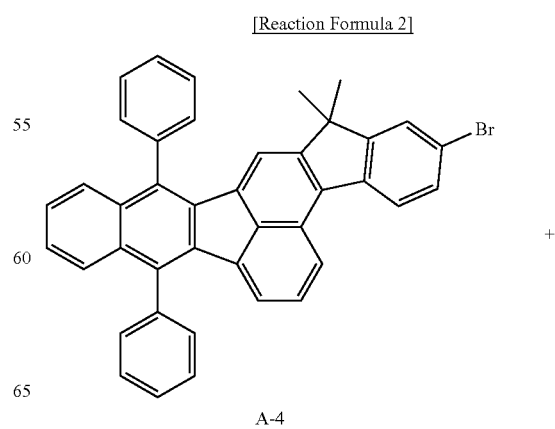

A-4

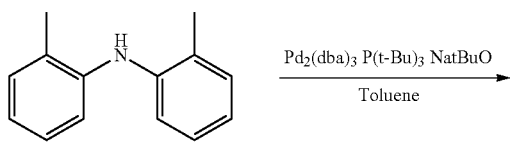

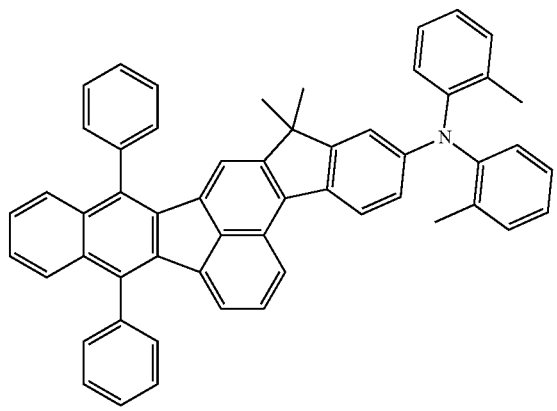

In the 2-neck flask (250 ml), the compound A-4 (1.50 g, 2.50 mmol), di-o-tolylamine (0.59 g, 3.00 mmol), Pd$_2$(dba)$_3$ (0.07 g, 0.08 mmol), P(t-Bu)$_3$ (0.02 g, 0.08 mmol) and NatBuO (0.72 g, 7.51 mmol) was dissolved in toluene (100 ml). The mixture was stirred for 12 hrs. After completion of reaction, the mixture was columned using MC and hexane (volume ratio=3:7) such that compound 1-2 was obtained. (1.3 g, yield: 75.58%)

3. Synthesis of Compound 1-9

[Reaction Formula 3]

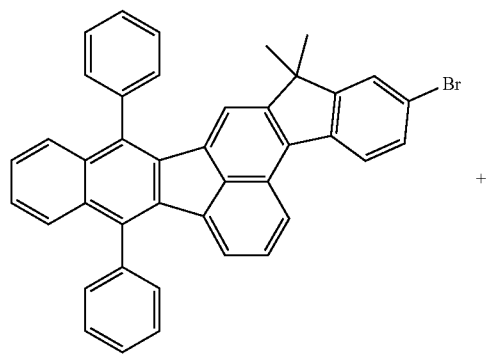

A-4

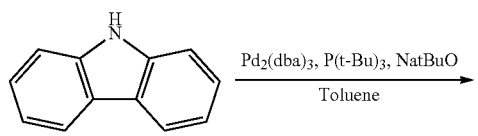

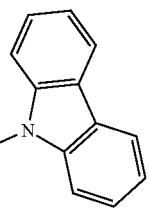

In the 2-neck flask (250 ml), the compound A-4 (1.70 g, 2.84 mmol), carbazole (0.57 g, 3.40 mmol), Pd$_2$(dba)$_3$ (0.08 g, 0.09 mmol), P(t-Bu)$_3$ (0.02 g, 0.09 mmol) and NatBuO (0.82 g, 8.51 mmol) was dissolved in toluene (100 ml). The mixture was stirred for 12 hrs. After completion of reaction, the mixture was columned using MC and hexane (volume ratio=3:7) such that compound 1-9 was obtained. (1.6 g, yield: 82.28%)

4. Synthesis of Compound 2-1

[Reaction Formula 4]

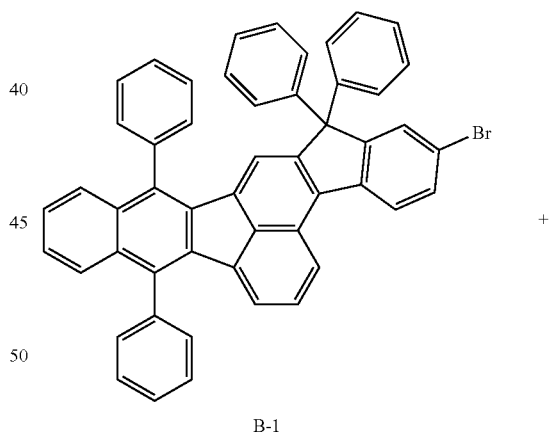

B-1

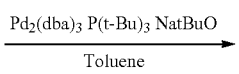

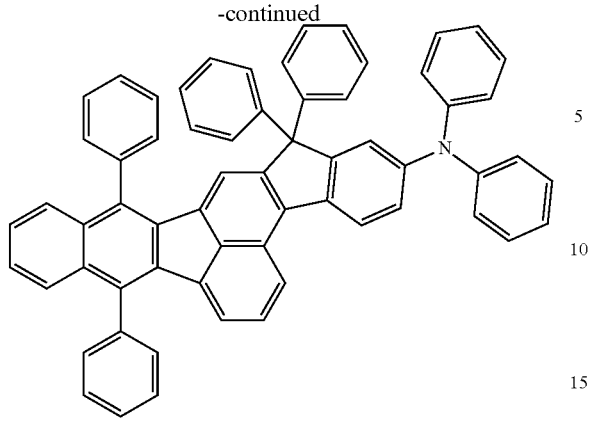

In the 2-neck flask (250 ml), the compound B-1 (1.40 g, 1.93 mmol), diphenylamine (0.39 g, 2.32 mmol), Pd$_2$(dba)$_3$ (0.05 g, 0.06 mmol), P(t-Bu)$_3$ (0.01 g, 0.06 mmol) and NatBuO (0.56 g, 5.80 mmol) was dissolved in toluene (100 ml). The mixture was stirred for 12 hrs. After completion of reaction, the mixture was columned using MC and hexane (volume ratio=3:7) such that compound 1-9 was obtained. (1.25 g, yield: 79.58%)

The EML 240 may further include a host. Namely, the organic compound of the present disclosure may serve as a dopant in the EML 240 and have a percentage by weight of about 0.01 to 10% in the EML 240.

For example, the host may be selected from Formula 4.

[Formula 4]

H1

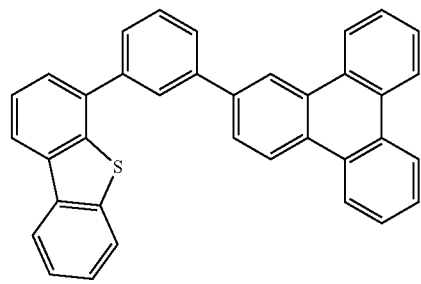

H2

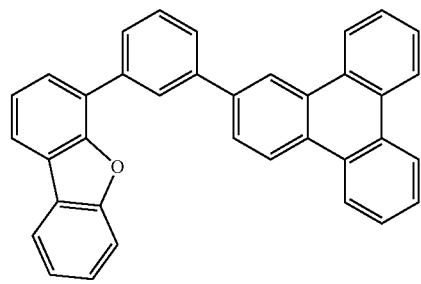

H3

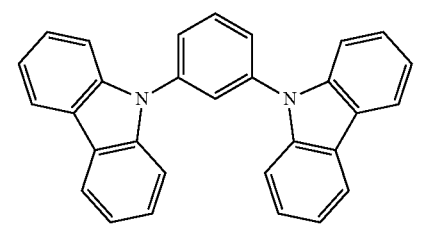

H4

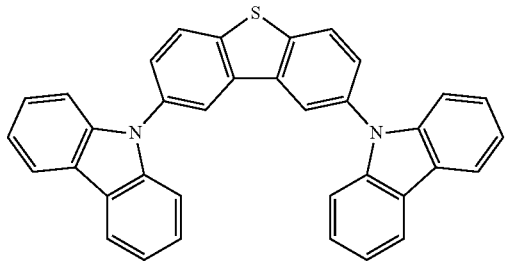

H5

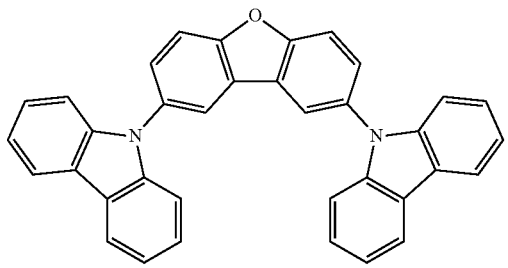

The EML 240 may further include a delayed fluorescent compound (material). In the EML 240, the organic compound of the present disclosure is used as a first dopant (fluorescent dopant), and the delayed fluorescent compound is used as a second dopant (delayed fluorescent dopant). In the EML 240, a summation of percentage by weight of the organic compound of the present disclosure and the delayed fluorescent compound may be about 20 to 40 wt %.

For example, the delayed fluorescent compound may be selected from Formula 5.

[Formula 5]

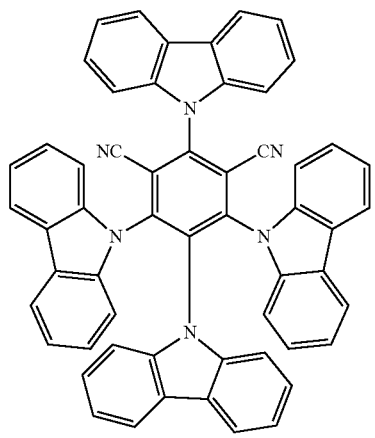

4CzIPN

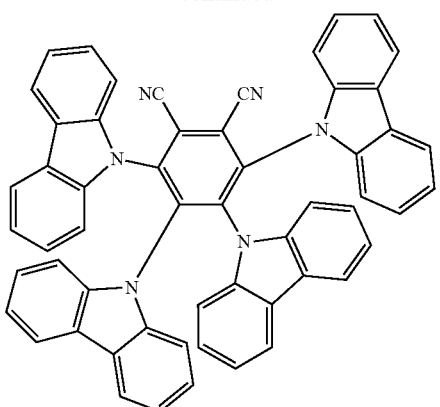

4CzPN

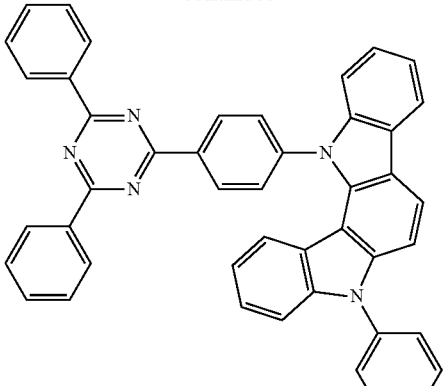

32aICTRZ

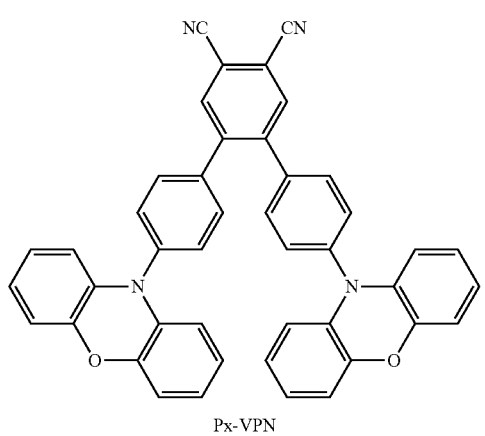

Px-VPN

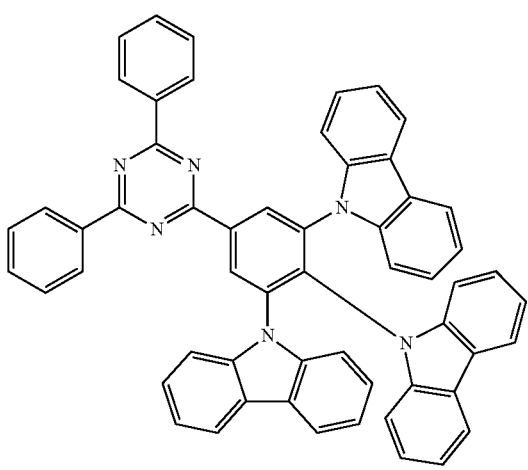

TCzTRZ

The percentage by weight of the delayed fluorescent dopant may be greater than that of the fluorescent dopant.

In the delayed fluorescent compound, a difference between the energy level of singlet state of the dopant and the energy level of triplet state of the dopant is equal to less than 0.3 eV. As a result, the energy level of triplet state of the delayed fluorescent dopant is converted into the energy level of singlet state of the delayed fluorescent dopant by the reverse intersystem crossing (RISC) effect.

Namely, the delayed fluorescent compound is configured such that a triplet exciton is activated by an electric field or heat and is thus up-converted into a singlet exciton, and accordingly, both of the triplet exciton and the singlet exciton are involved in light emission.

Since the EML 240 includes both the organic emitting compound of the present disclosure as the fluorescent dopant and the delayed fluorescent dopant, the exciton of the host is transferred into the delayed fluorescent dopant and the emission is generated from the fluorescent dopant. The light from the delayed fluorescent dopant is absorbed by the fluorescent dopant. As a result, the emission is finally provided from the fluorescent dopant.

the singlet energy and the triplet energy of the delayed fluorescent dopant are transferred into the organic emitting compound of the present disclosure as the fluorescent dopant and the emission is provided from the organic emitting compound of the present disclosure as the fluorescent dopant. As result, the quantum efficiency of the OLED D is increased, and the FWHM of the OLED D is narrowed.

Since both of the triplet exciton and the singlet exciton in the delayed fluorescent dopant are involved in light emission, the emission efficiency is improved. Since the fluorescent dopant emits light by absorbing the light from the delayed fluorescent dopant, the color purity of the light from the EML 240 is improved.

The energy level of the singlet state of the delayed fluorescent dopant is greater than the energy level of the singlet state of the fluorescent dopant. The energy level of the singlet state of the host is greater than the energy level of the singlet state of the delayed fluorescent dopant. In addition, the energy level of the triplet state of the delayed fluorescent dopant is smaller than the energy level of the triplet state of the host and greater than the energy level of the triplet state of the fluorescent dopant. Moreover, the energy level of the singlet state of the host is greater than the energy level of the singlet state of the fluorescent dopant.

[OLED]

Following layers are sequentially deposited on an ITO layer (anode).

(a) HIL (compound of Formula 6 (HATCN), 7 nm), (b) HTL (compound of Formula 7 (NPB), 55 nm), (c) EBL (compound of Formula 8 (m-CBP), 10 nm), (d) EML (35 nm), (e) HBL (compound of Formula 9 (B3PYMPM), 10 nm), (f) ETL (compound of Formula 10 (TPBi), 20 nm), (g) EIL (LiF), and (h) Cathode (Al)

[Formula 6]

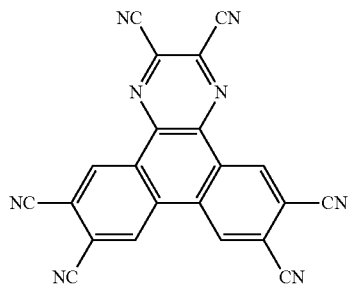

[Formula 7]

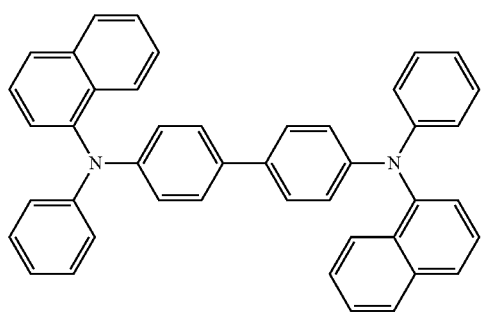

[Formula 8]

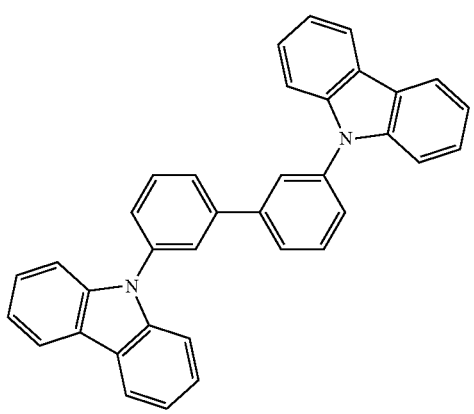

[Formula 9]

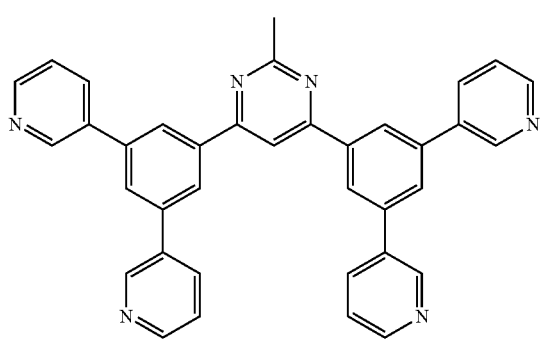

[Formula 10]

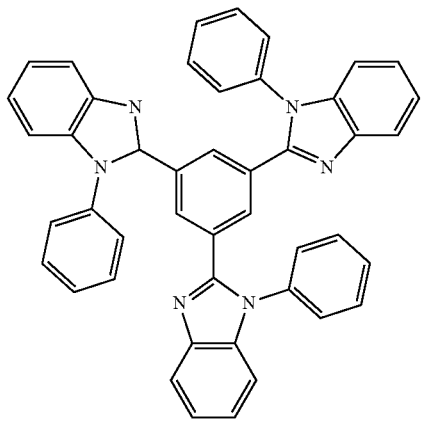

(1) Reference Example 1

In the EML, the compound H-1 of Formula 4 (65 wt %) is used as the host, and the compound "4CzIPN" of Formula 5 (35 wt %) is used as the delayed fluorescent dopant.

(2) Reference Example 2

In the EML, the compound H-1 of Formula 4 (64.5 wt %) is used as the host, and the compound "4CzIPN" of Formula 5 (35 wt %) and the compound of Formula 11 (0.5 wt %) are respectively used as the delayed fluorescent dopant and the fluorescent dopant.

(3) Example 1

In the EML, the compound H-1 of Formula 4 (64.5 wt %) is used as the host, and the compound "4CzIPN" of Formula 5 (35 wt %) and the compound 1-1 of Formula 3 (0.5 wt %) are respectively used as the delayed fluorescent dopant and the fluorescent dopant.

(4) Example 2

In the EML, the compound H-1 of Formula 4 (64.5 wt %) is used as the host, and the compound "4CzIPN" of Formula 5 (35 wt %) and the compound 1-2 of Formula 3 (0.5 wt %) are respectively used as the delayed fluorescent dopant and the fluorescent dopant.

(5) Example 3

In the EML, the compound H-1 of Formula 4 (64.5 wt %) is used as the host, and the compound "4CzIPN" of Formula 5 (35 wt %) and the compound 1-9 of Formula 3 (0.5 wt %) are respectively used as the delayed fluorescent dopant and the fluorescent dopant.

(6) Example 4

In the EML, the compound H-1 of Formula 4 (64.5 wt %) is used as the host, and the compound "4CzIPN" of Formula 5 (35 wt %) and the compound 2-1 of Formula 3 (0.5 wt %) are respectively used as the delayed fluorescent dopant and the fluorescent dopant.

[Formula 11]

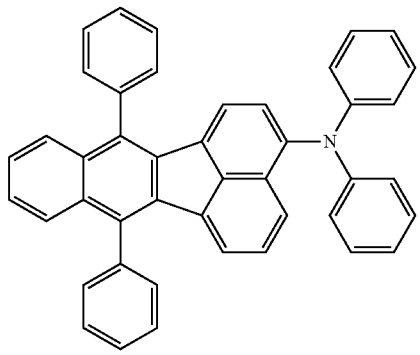

Figure 3:
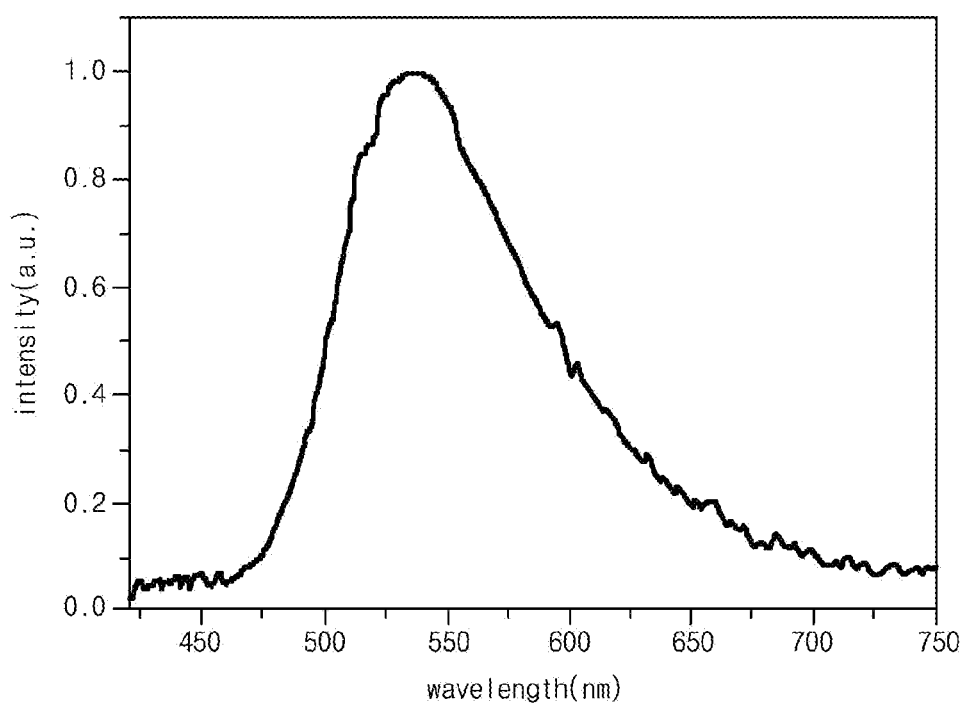
FIG. 3 is a graph showing a maximum emission wavelength of an organic compound "4CzIPN".
Figure 4:
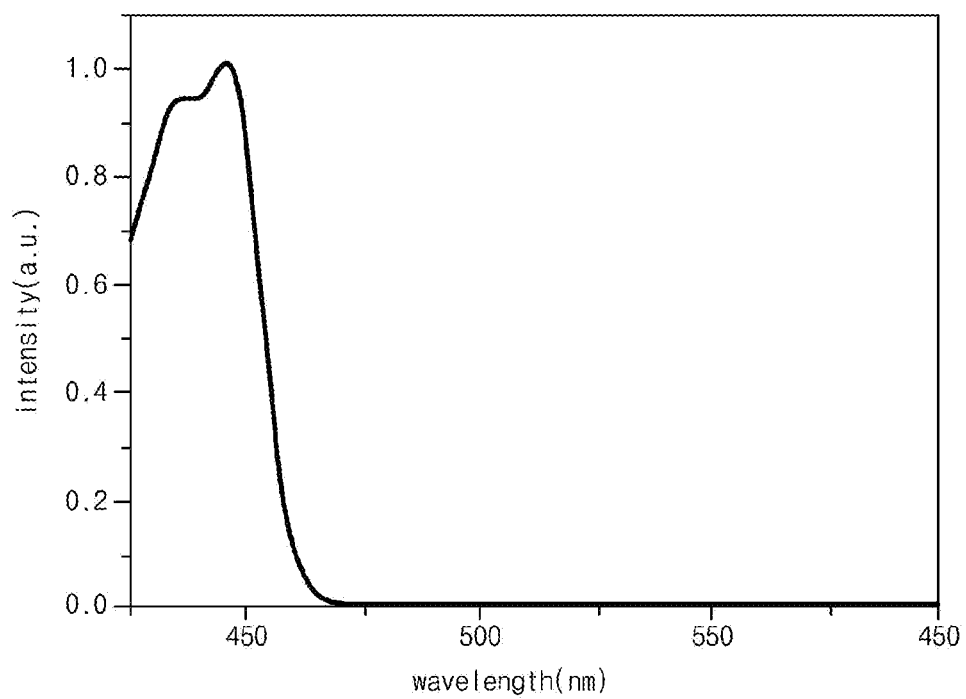
FIG. 4 is a graph showing a maximum absorption wavelength of the reference compound.

The maximum emission wavelength of the compound "4CzIPN" of Formula 5 and the maximum emission wavelength and the maximum absorption wavelength of the compounds 1-1, 1-2, 1-9 and 2-1 of Formula 3 and the compound of Formula 11 are measured and listed in Table 1. The maximum emission wavelength ($\lambda$max_e) of the compound "4CzIPN" of Formula 5 is shown in FIG. 3, and the maximum absorption wavelength ($\lambda$max_a) of Formula 11 (reference compound) is shown in FIG. 4. The maximum absorption wavelength of the compounds 1-1 and 1-2 of Formula 3 is shown in FIG. 5.

TABLE 1

|  | $\lambda$max_a (nm) | $\lambda$max_e (nm) |
| --- | --- | --- |
| 4CzIPN | — | 530 |
| Reference compound | 445 | 507 |
| Compound 1-1 | 480 | 544 |
| Compound 1-2 | 484 | 544 |
| Compound 1-9 | 475 | 546 |
| Compound 2-1 | 476 | 546 |

Figure 5:
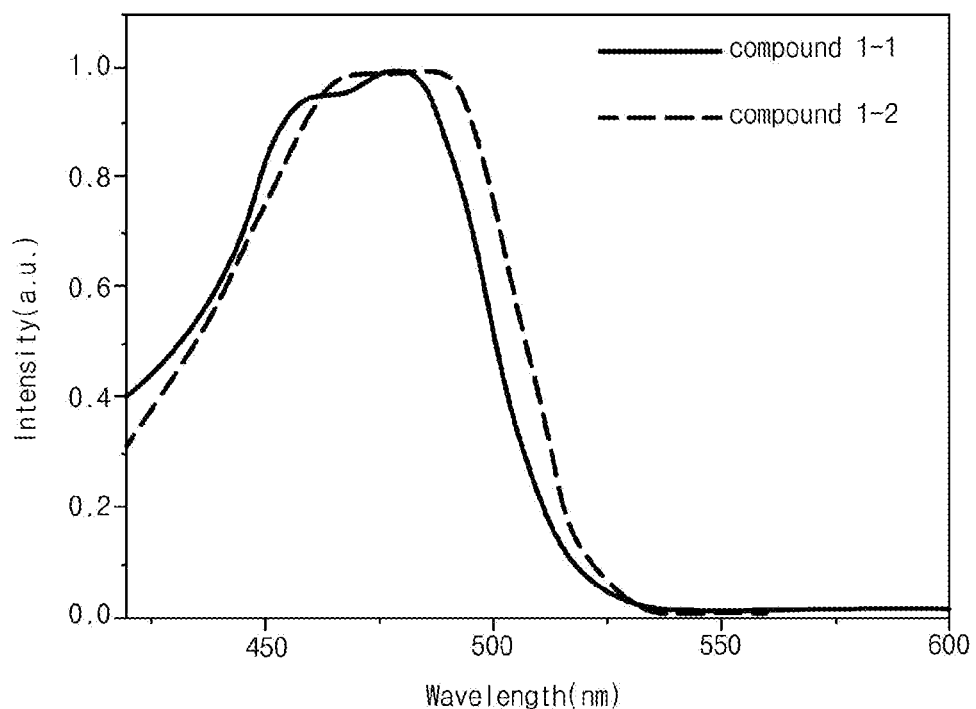
FIG. 5 is a graph showing a maximum absorption wavelength of an organic compound of the present disclosure.

Referring to Table 1 and FIGS. 3 to 5, the overlapping possibility of the emitting wavelength range of the compound "4CzIPN" and the absorption wavelength range of the reference compound is low. However, the overlapping possibility of the absorption wavelength range of the organic compound of the present disclosure and the emitting wavelength range of the compound "4CzIPN" is significantly increased.

The properties, i.e., the driving voltage ([V]), the current efficiency ([cd/A]), the power efficiency ([lm/W]), the external quantum efficiency (EQE), the CIE color coordinate, the maximum EL (ELmax) and the FWHM, of the organic light emitting diodes of Reference Examples 1 and 2 and Examples 1 to 4 are measured and listed in Table 2.

TABLE 2

|  | V | cd/A | lm/W | EQE (%) | CIE | EL$_{\lambda max}$ (nm) | FWHM |
| --- | --- | --- | --- | --- | --- | --- | --- |
| Ref1 | 4.90 | 44.10 | 28.10 | 14.90 | (0.374, 0.586) | 536 | 84.6 |
| Ref2 | 4.54 | 12.88 | 8.92 | 5.23 | (0.227, 0.487) | 501 | 74 |
| Ex1 | 3.82 | 52.93 | 43.55 | 16.68 | (0.399, 0.563) | 544 | 64 |
| Ex2 | 3.80 | 51.64 | 42.67 | 16.39 | (0.399, 0.561) | 544 | 60 |
| Ex3 | 3.94 | 49.24 | 39.25 | 15.66 | (0.421, 0.554) | 546 | 65 |
| Ex4 | 4.12 | 45.64 | 34.79 | 15.03 | (0.419, 0.554) | 546 | 66 |

As shown in Table 2, in comparison to the OLED in Reference Examples 1 and 2, the OLED of Examples 1 to 4 including the organic compound of the present disclosure as the fluorescent dopant and the delayed fluorescent dopant has improved emitting efficiency and narrow FWHM.

In Reference Example 1, where the delayed fluorescent dopant without the fluorescent dopant is used in the EML, the OLED has relatively high emitting efficiency but bad color purity (wide FWHM). In Reference Example 2, where the delayed fluorescent dopant and the compound of Formula 11 as the fluorescent dopant are used in the EML, the excitons of the delayed fluorescent dopant may be quenched and the emission may be directly provided from the fluorescent dopant such that the emitting efficiency is significantly lowered. Namely, since the maximum absorption wavelength of the compound of Formula 11 (about 445 nm) is short, the overlapping possibility of the emitting wavelength range of the delayed fluorescent dopant and the absorption wavelength range of the reference compound is decreased.

However, the organic compound of the present disclosure includes the benzoindenofluoranthene core, where fluorene is fused in fluoranthene, such that the conjugation length may be increased. Accordingly, the absorption wavelength range and the emission wavelength range of the organic compound is increased (long wavelength shift), and the overlapping possibility of the absorption wavelength range of the organic compound of the present disclosure and the emitting wavelength range of the delayed fluorescent dopant is increased.

In the OLED of Examples 1 to 4 including the organic compound of the present disclosure and the delayed fluorescent dopant, the emission wavelength (536 nm) of the delayed fluorescent dopant is absorbed by the organic compound of the present disclosure such that high emitting efficiency and the narrow FWHM are provided.

Figure 6:
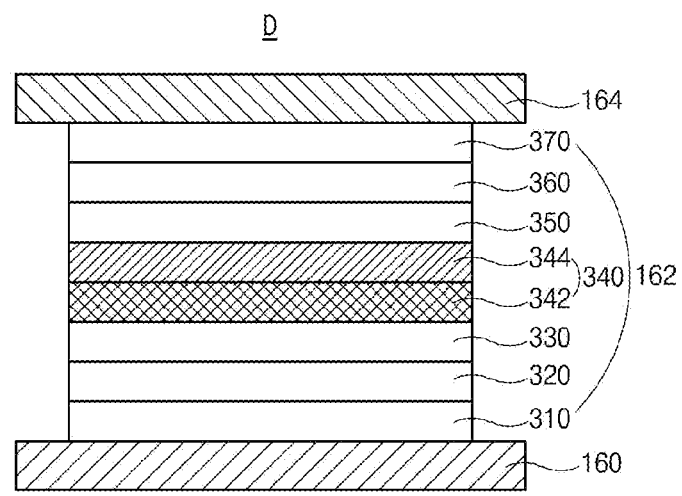
FIG. 6 is a schematic-cross sectional view of an OLED according to a second embodiment of the present disclosure.

FIG. 6 is a schematic-cross sectional view of an OLED according to a second embodiment of the present disclosure.

As shown in FIG. 6, an OLED D includes the first and second electrodes 160 and 164, which face each other, and the organic emitting layer 162 therebetween. The organic emitting layer 162 includes an EML 340, which includes first and second layers 342 and 344 and is positioned between the first and second electrodes 160 and 164, an HTL 320 between the first electrode 160 and the EML 340 and an ETL 360 between the second electrode 164 and the EML 340.

In addition, the organic emitting layer 162 may further include a HIL 310 between the first electrode 160 and the HTL 320 and an EIL 370 between the second electrode 164 and the ETL 360.

Moreover, the organic emitting layer 162 may further include an EBL 330 between the HTL 320 and the EML 340 and a HBL 350 between the EML 340 and the ETL 360.

For example, in the EML 340, one of the first layer 342 (e.g., a first emitting material layer) and the second layer 344 (e.g., a second emitting material layer) may include the organic compound of the present disclosure as a first dopant (a fluorescent dopant) and a first host. The other one of the first and second layers 342 and 344 may include a delayed fluorescent compound as a second dopant (a delayed fluorescent dopant) and a second host. The one of the first and second layers 342 and 344 including the organic compound of the present disclosure may further include a delayed fluorescent compound as a third dopant.

Each of the second and third dopants of the delayed fluorescent dopant may be selected from the compounds of Formula 5. The second and third dopants may be same or different.

Each of the first and second hosts may be selected from the compounds of Formula 4, but it is not limited thereto. The first and second hosts may be same or different.

The organic light emitting diode, where the first layer 342 includes the fluorescent dopant and the first host, will be explained.

In the first layer 342, the fluorescent dopant may have a percentage by weight of approximately 0.1 to 10 wt %. In the second layer 344, the delayed fluorescent dopant may have a percentage by weight of approximately 10 to 40 wt %.

In the OLED D, since the first layer 342 of the EML 340 includes the organic emitting compound of the present disclosure as the fluorescent dopant and the second layer 344 of the EML 340 includes the delayed fluorescent compound as the delayed fluorescent dopant, the fluorescent dopant absorbs the light generated in the delayed fluorescent dopant, which has high quantum efficiency, and finally emits the light.

Accordingly, the quantum efficiency of the OLED D is increased, and the FWHM of the OLED D is narrowed.

For example, the host of the first layer 342 may be same as a material of the EBL 330. In this instance, the first layer 342 may have an electron blocking function with an emission function. Namely, the first layer 342 may serve as a buffer layer for blocking the electron. When the EBL 330 is omitted, the first layer 342 serves as an emitting material layer and an electron blocking layer.

On the other hand, when the first layer 342 includes the delayed fluorescent dopant and the second layer 344 includes the organic compound of the present disclosure, the host of the second layer 344 may be same as a material of the HBL 350. In this instance, the second layer 344 may have a hole blocking function with an emission function. Namely, the second layer 344 may serve as a buffer layer for blocking the hole. When the HBL 350 is omitted, the second layer 344 serves as an emitting material layer and a hole blocking layer.

Figure 7:
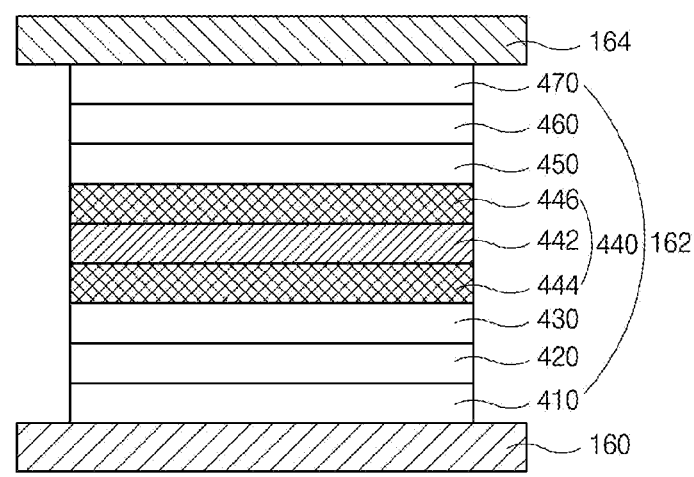
FIG. 7 is a schematic-cross sectional view of an OLED according to a third embodiment of the present disclosure.

FIG. 7 is a schematic-cross sectional view of an OLED according to a third embodiment of the present disclosure.

As shown in FIG. 7, an organic light emitting diode D includes the first and second electrodes 160 and 164, which face each other, and the organic emitting layer 162 therebetween. The organic emitting layer 162 includes an EML 440, which includes first to third layers 442, 444 and 446 and is positioned between the first and second electrodes 160 and 164, a HTL 420 between the first electrode 160 and the EML 440 and an ETL 460 between the second electrode 164 and the EML 440.

In addition, the organic emitting layer 162 may further include a HIL 410 between the first electrode 160 and the HTL 420 and an EIL 470 between the second electrode 164 and the ETL 460.

Moreover, the organic emitting layer 162 may further include an EBL 430 between the HTL 420 and the EML 440 and a HBL 450 between the EML 440 and the ETL 460.

In the EML 440, the first layer 442 is positioned between the second layer 444 and the third layer 446. Namely, the second layer 444 is positioned between the EBL 430 and the first layer 442, and the third layer 446 is positioned between the first layer 442 and the HBL 450.

The first layer 442 (e.g., a first emitting material layer) includes a delayed fluorescent compound as a first dopant (a delayed fluorescent dopant) and a first host. The second layer 444 includes the organic emitting compound of the present disclosure as a second dopant (a first fluorescent dopant) and a second host, and the third layer 446 includes the organic emitting compound of the present disclosure as a third dopant (a second fluorescent dopant) and a third host. Namely, the first layer 442 includes the delayed fluorescent dopant, and each of the second and third layers 444 and 446 includes the fluorescent dopant.

The second and third layers 444 and 446 may further include a fourth dopant and fifth dopant of a delayed fluorescent compound, respectively.

The second and third dopants as the fluorescent dopant may be same or different. The first, fourth and fifth dopants as the delayed fluorescent dopant may be selected from the compounds of Formula 5. The first, fourth and fifth dopants may be same or different.

Each of the first to third hosts may be selected from the compounds of Formula 4, but it is not limited thereto. The first to third hosts may be same or different.

In the first layer 442, the delayed fluorescent dopant may have a percentage by weight of approximately 10 to 40 wt %. In each of the second and third layers 444 and 446, the first and second fluorescent dopants may have a percentage by weight of approximately 0.1 to 10 wt %.

In the OLED D, since the first layer 442 of the EML 440 includes the delayed fluorescent compound as the delayed fluorescent dopant and each of the second and third layers 444 and 446 includes the organic emitting compound of the present disclosure as the fluorescent dopant, the fluorescent dopant absorbs the light generated in the delayed fluorescent dopant, which has high quantum efficiency, and finally emits the light.

Accordingly, the quantum efficiency of the OLED D is increased, and the FWHM of the OLED D is narrowed.

For example, the host of the second layer 444 may be same as a material of the EBL 430. In this instance, the second layer 444 may have an electron blocking function with an emission function. Namely, the second layer 444 may serve as a buffer layer for blocking the electron. When the EBL 430 is omitted, the second layer 444 serves as an emitting material layer and an electron blocking layer.

The host the third layer 446 may be same as a material of the HBL 450. In this instance, the third layer 446 may have a hole blocking function with an emission function. Namely, the third layer 446 may serve as a buffer layer for blocking the hole. When the HBL 450 is omitted, the third layer 446 serves as an emitting material layer and a hole blocking layer.

The host of the second layer 444 may be same as a material of the EBL 430, and the host the third layer 446 may be same as a material of the HBL 450. In this instance, the second layer 444 may have an electron blocking function with an emission function, and third layer 446 may have a hole blocking function with an emission function. Namely, the second layer 444 and the third layer 446 may serve as a buffer layer for blocking the electron and a buffer layer for blocking the hole, respectively. When the EBL 430 and the HBL 450 are omitted, the second layer 444 serves as an emitting material layer and an electron blocking layer, and the third layer 446 serves as an emitting material layer and a hole blocking layer.

It will be apparent to those skilled in the art that various modifications and variations can be made in the organic compound, the organic light emitting diode, and organic light emitting display device including the same of the present disclosure without departing from the spirit or scope of the present disclosure. Thus, it is intended that the present disclosure cover the modifications and variations of the present disclosure provided they come within the scope of the appended claims and their equivalents.

What is claimed is:

1. An organic light emitting diode, comprising:
a first electrode;
a second electrode facing the first electrode; and
a first emitting material layer positioned between the first and second electrodes and including an organic compound,
wherein the organic compound is used as a first fluorescent dopant, and the first emitting material layer further includes a first host,
wherein the organic compound is selected from the group consisting of the compounds 1-6 to 1-8, 1-22 to 1-25, 2-6 to 2-8, and 2-22 to 2-25:

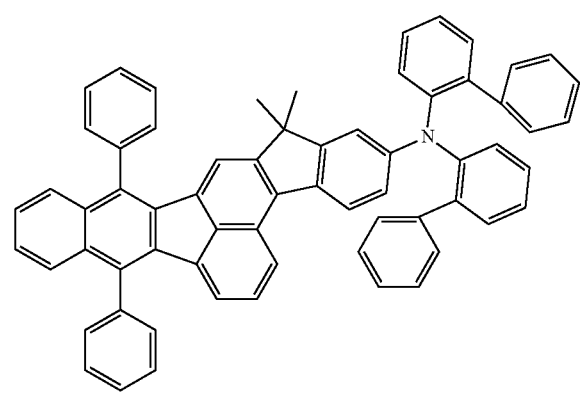

1-6

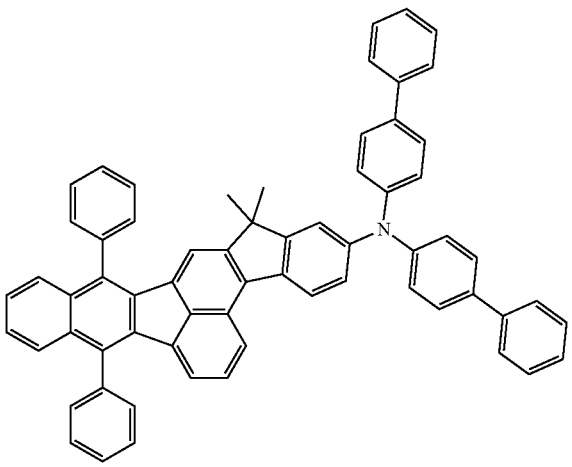

1-8

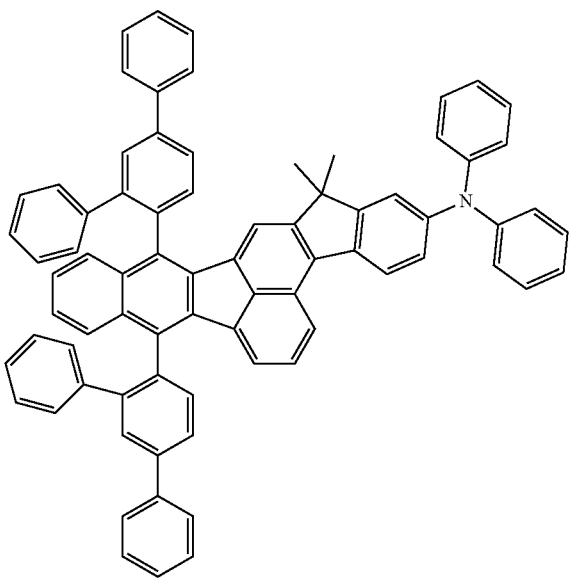

1-22

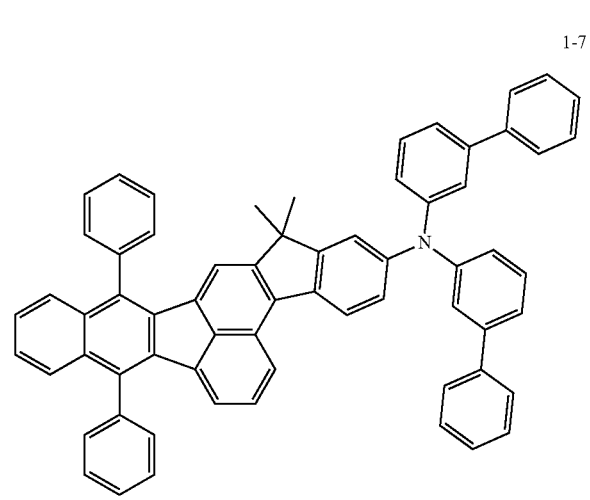

1-7

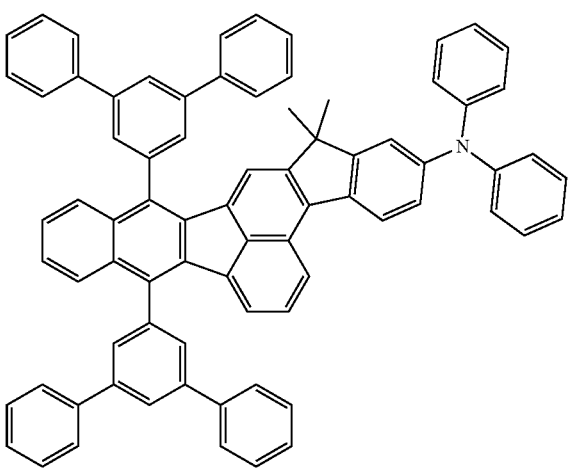

1-23

1-24
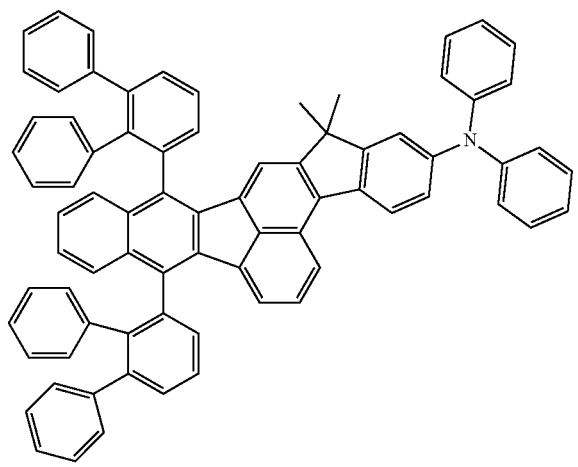
2-7
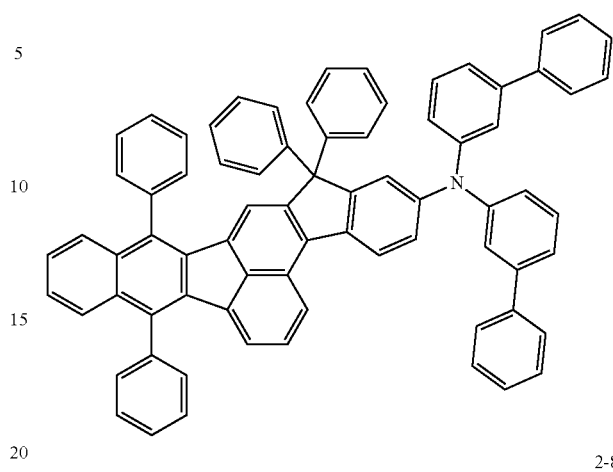
1-25
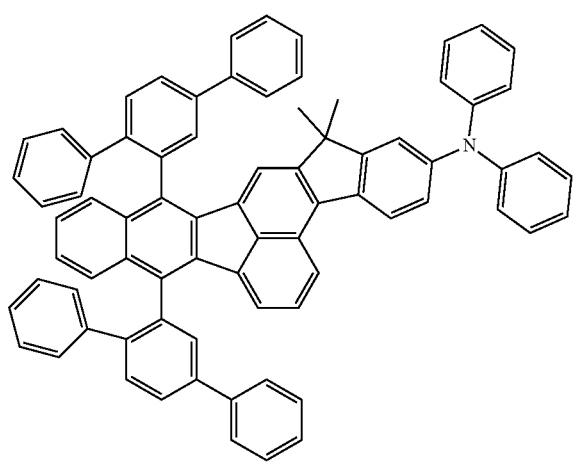
2-8
2-6
2-22
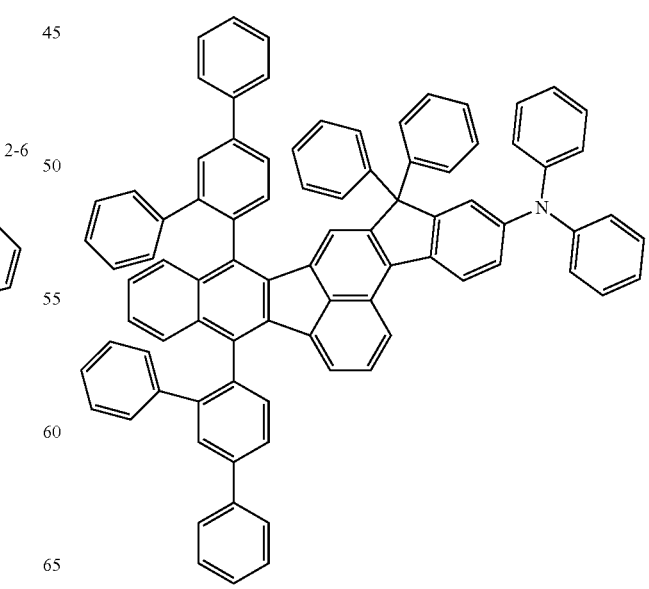

2-23
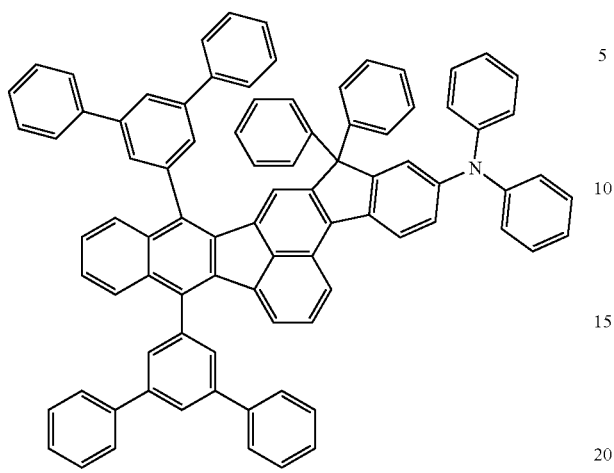
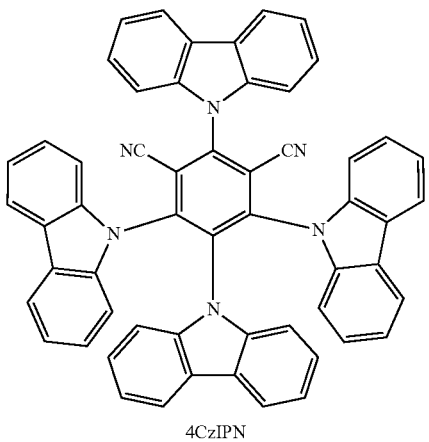
4CzIPN
2-24
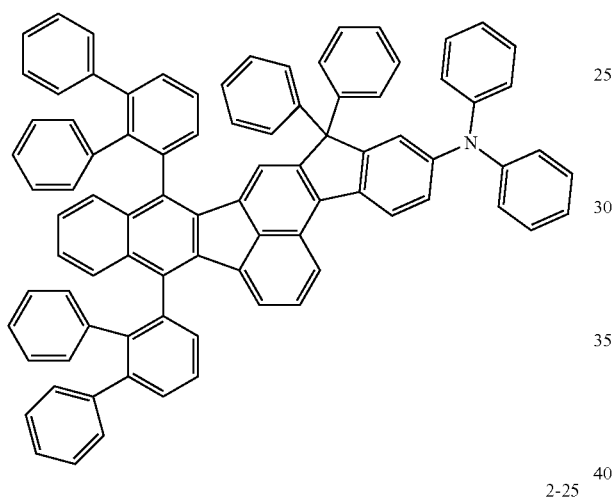
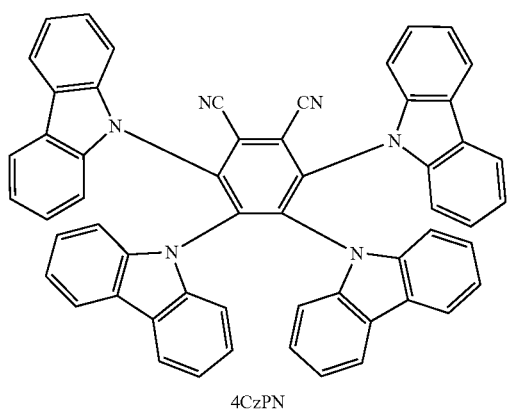
4CzPN
2-25
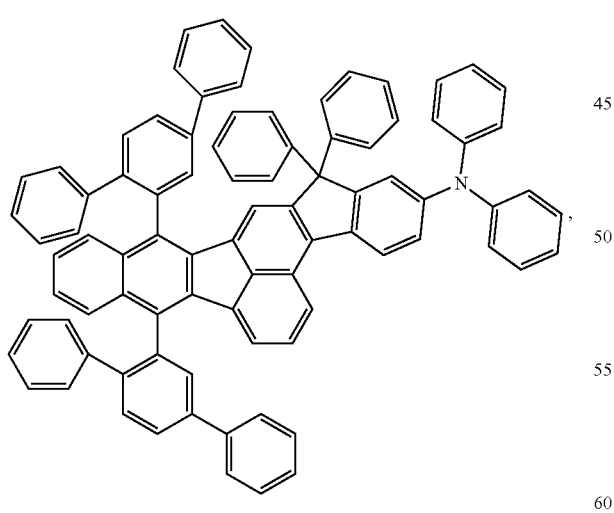
,
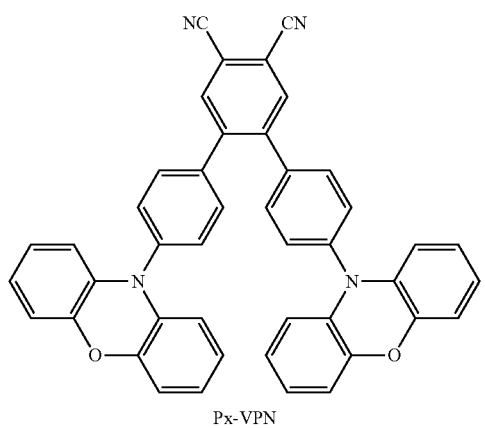
Px-VPN
wherein the first emitting material layer further includes a delayed fluorescent dopant, and
wherein the delayed fluorescent dopant is selected from the group consisting of the compounds 4CzIPN, 4CzPN, Px-VPN, TCzTRZ and 32a1CTRZ:

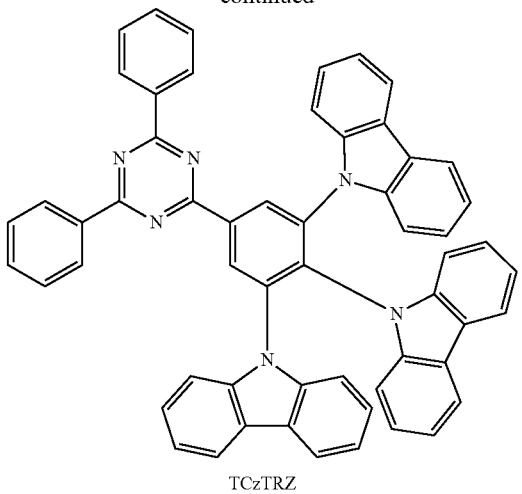

TCzTRZ

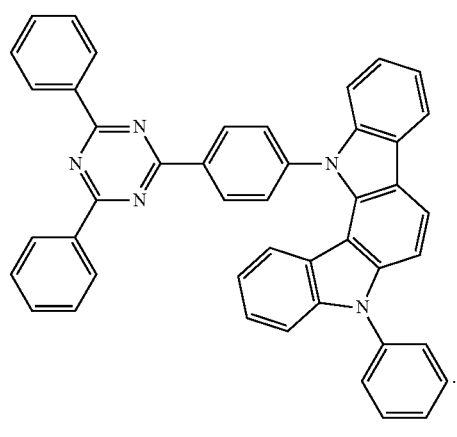

32a1CTRZ

2. The organic light emitting diode according to claim 1, wherein the first host is selected from the group consisting of:

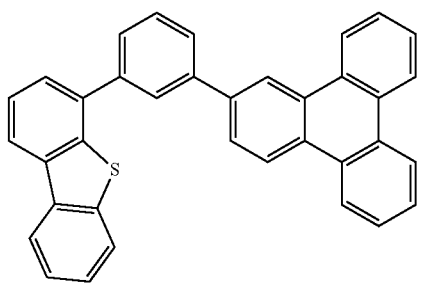

H1

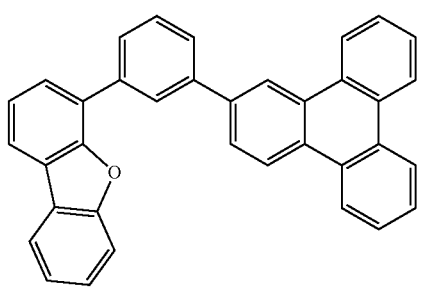

H2

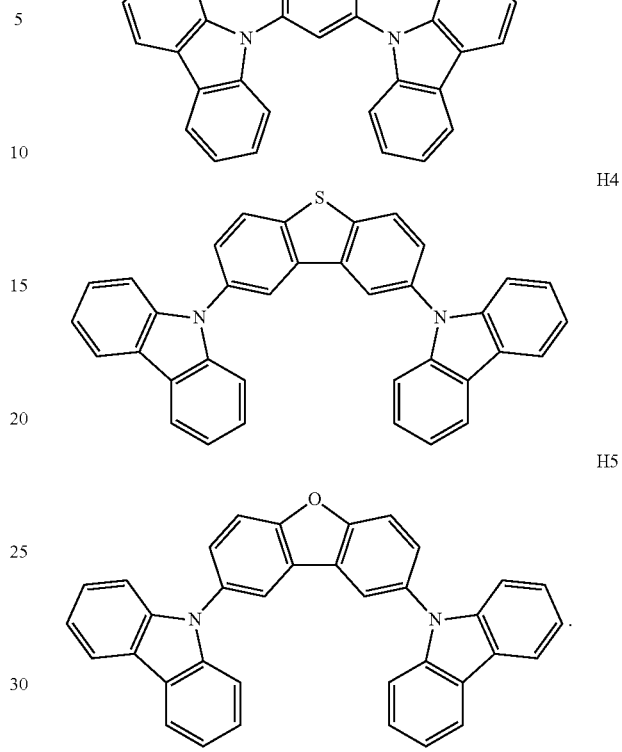

3. The organic light emitting diode according to claim 1, further comprising a second emitting material layer positioned between the first emitting material layer and the first electrode and including a second host and a delayed fluorescent dopant,
wherein the delayed fluorescent dopant in the second emitting material layer is selected from the group consisting of the compounds 4CzIPN, 4CzPN, Px-VPN, TCzTRZ and 32a1CTRZ.

4. The organic light emitting diode according to claim 3, further comprising:
a hole blocking layer between the second electrode and the first emitting material layer,
wherein the first host is same as a material of the hole blocking layer.

5. The organic light emitting diode according to claim 3, further comprising a third emitting material layer positioned between the second emitting material layer and the first electrode and including a third host and a second fluorescent dopant,
wherein the second fluorescent dopant is selected from the group consisting of the compounds 1-6 to 1-8, 1-22 to 1-25, 2-6 to 2-8, and 2-22 to 2-25.

6. The organic light emitting diode according to claim 5, further comprising:
an electron blocking layer between the first electrode and the third emitting material layer; and
a hole blocking layer between the second electrode and the first emitting material layer,
wherein the first host is same as a material of the hole blocking layer, and the third host is same as a material of the electron blocking layer.

7. The organic light emitting diode according to claim 1, further comprising a second emitting material layer positioned between the first emitting material layer and the second electrode and including a second host and a delayed fluorescent dopant, and
wherein the delayed fluorescent dopant in the second emitting material layer is selected from the group consisting of the compounds 4CzIPN, 4CzPN, Px-VPN, TCzTRZ and 32a1CTRZ.

8. The organic light emitting diode according to claim 7, further comprising:
an electron blocking layer between the first electrode and the first emitting material layer,
wherein the first host is same as a material of the electron blocking layer.

9. An organic light emitting display device, comprising:
a substrate;
an organic light emitting diode on the substrate, the organic light emitting diode including:
a first electrode;
a second electrode facing the first electrode; and
a first emitting material layer positioned between the first and second electrodes and including an organic compound,
wherein the organic compound is used as a first fluorescent dopant, and the first emitting material layer further includes a first host,
wherein the organic compound is selected from the group consisting of the compounds 1-6 to 1-8, 1-22 to 1-25, 2-6 to 2-8, and 2-22 to 2-25:

1-6
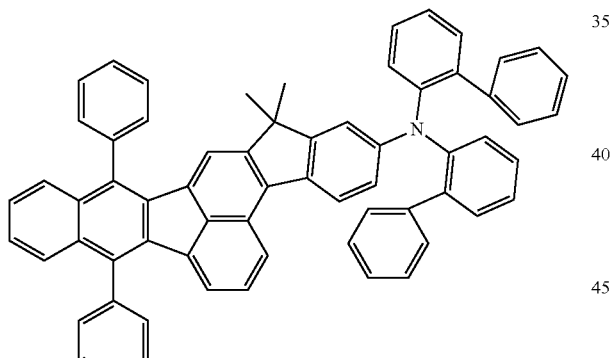

1-7
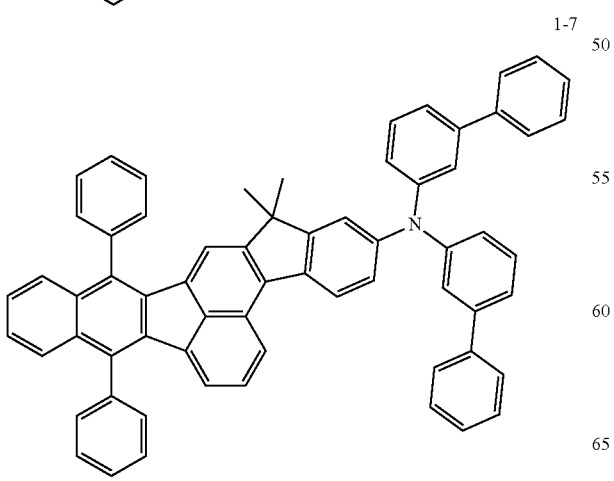

1-8
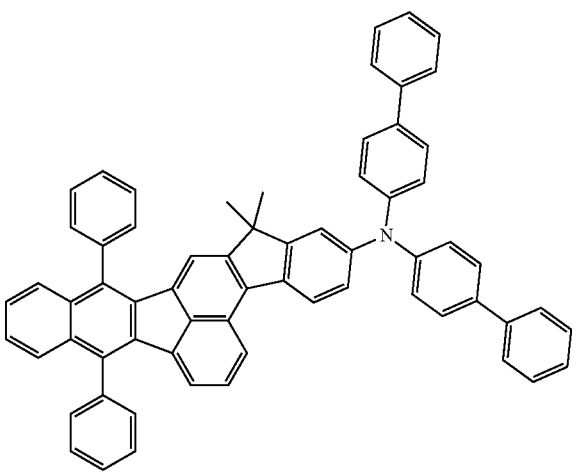

1-22
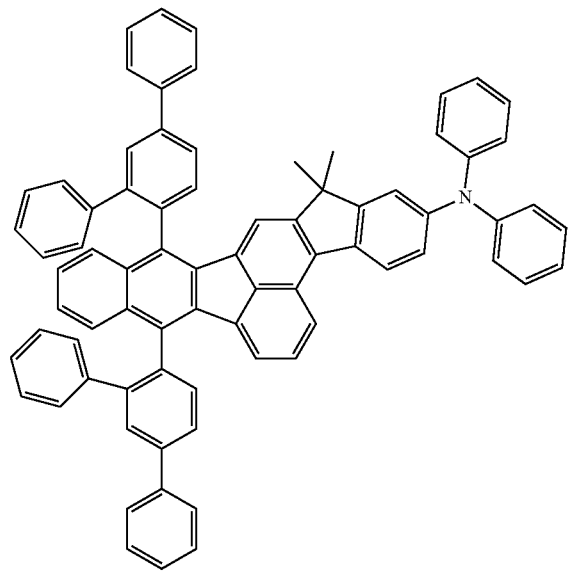

1-23

1-24
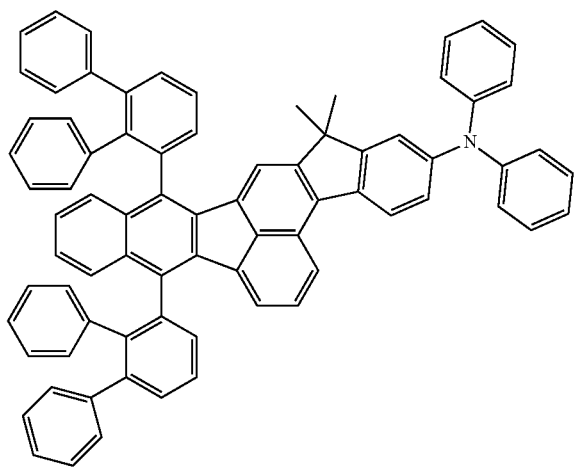
2-7
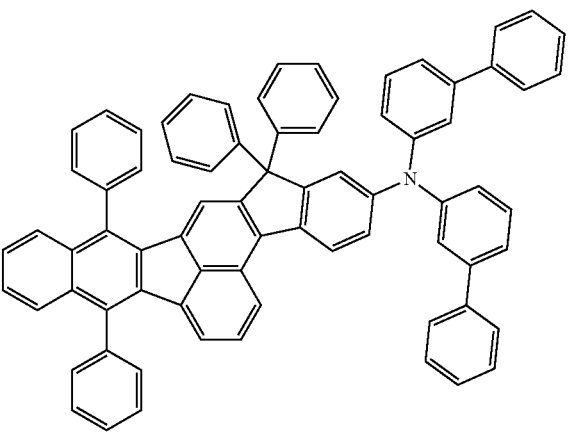
1-25
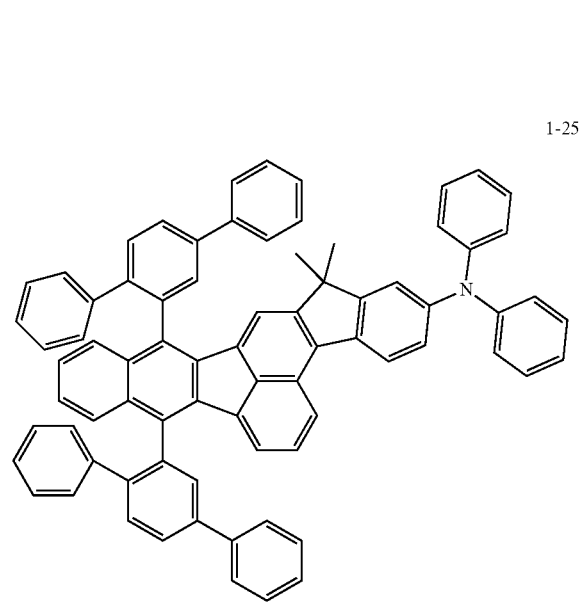
2-8
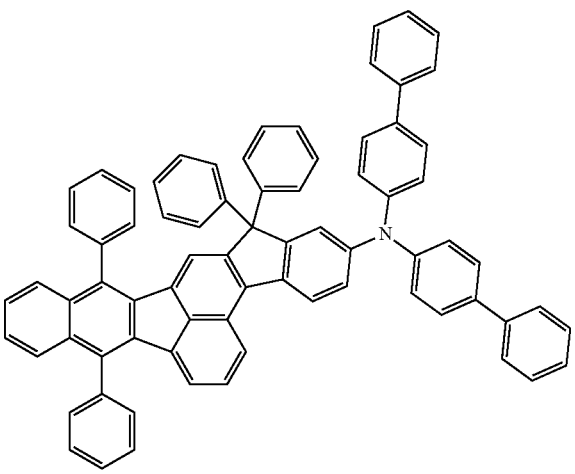
2-6
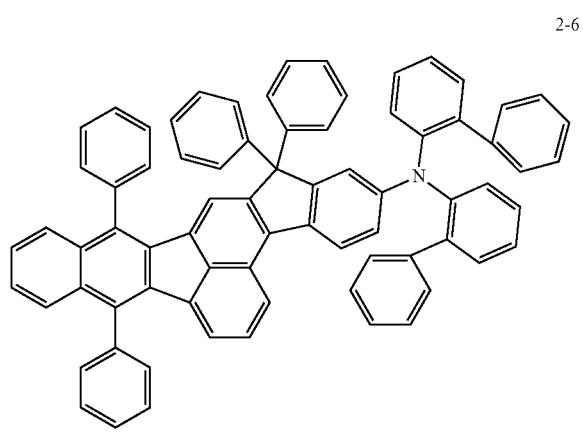
2-22
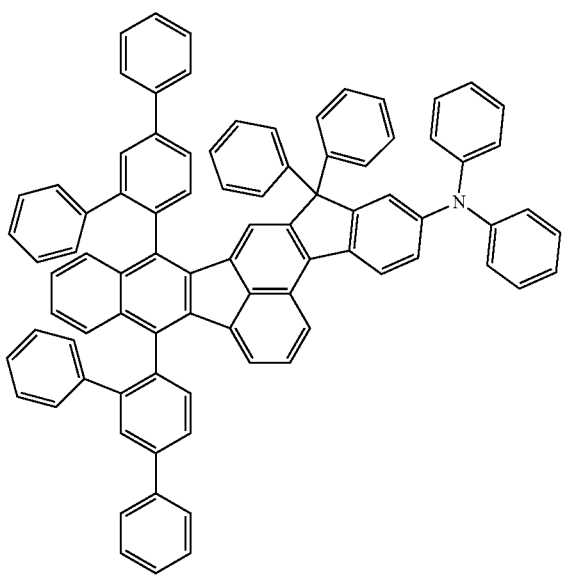

2-23
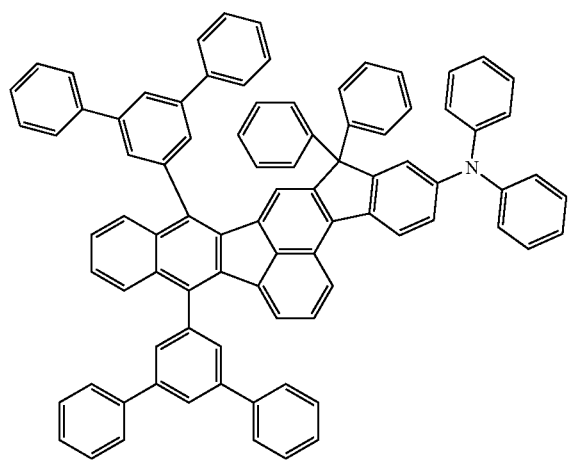
2-24
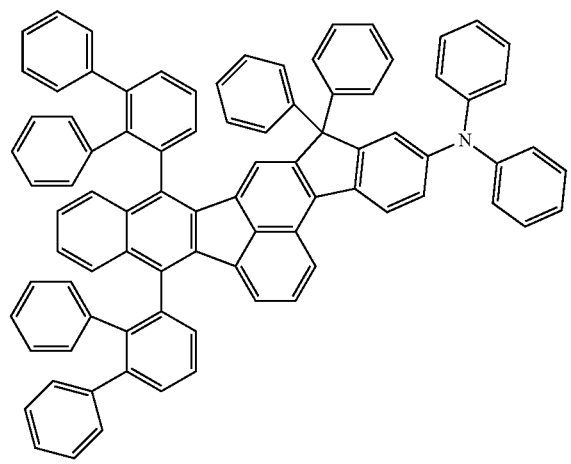
2-25
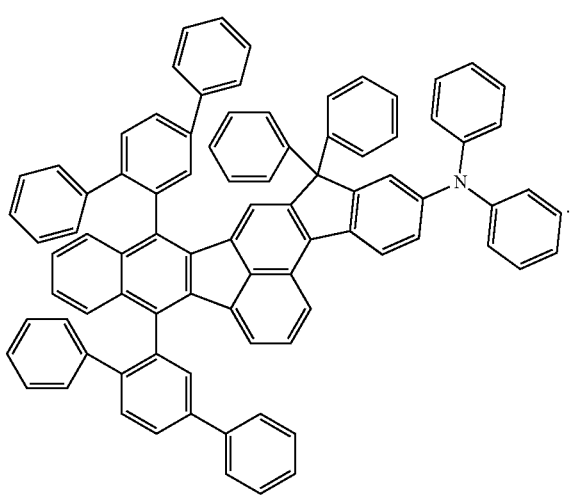
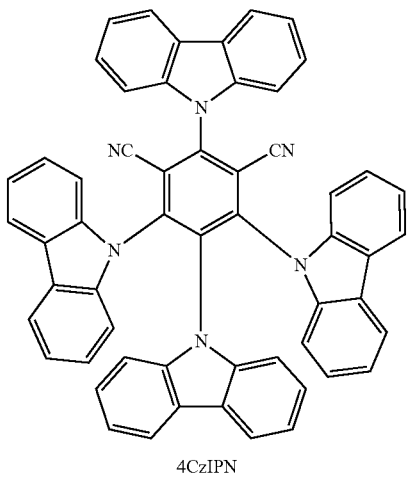
4CzIPN
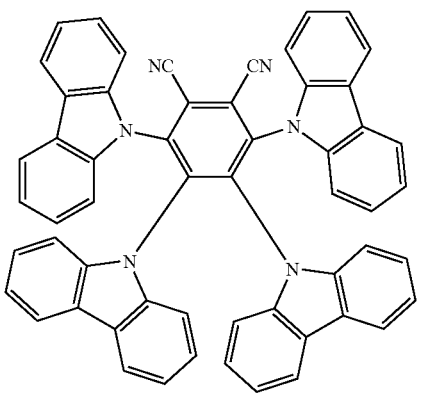
4CzPN
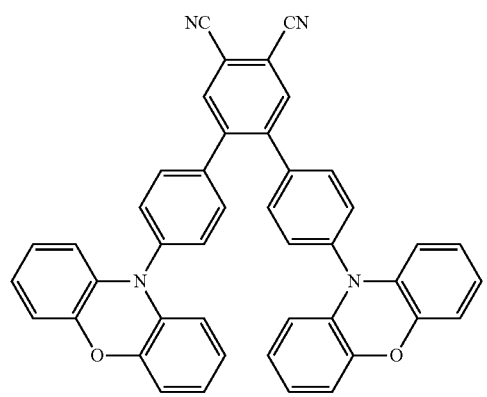
Px-VPN
wherein the first emitting material layer further includes a delayed fluorescent dopant, and
wherein the delayed fluorescent dopant is selected from the group consisting of the compounds 4CzIPN, 4CzPN, Px-VPN, TCzTRZ and 32a1CTRZ:

-continued

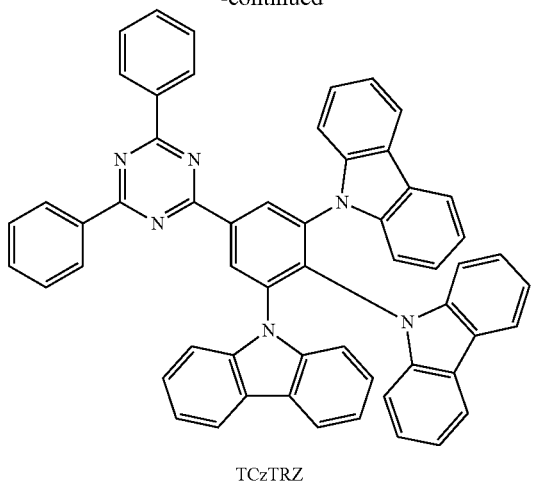

TCzTRZ

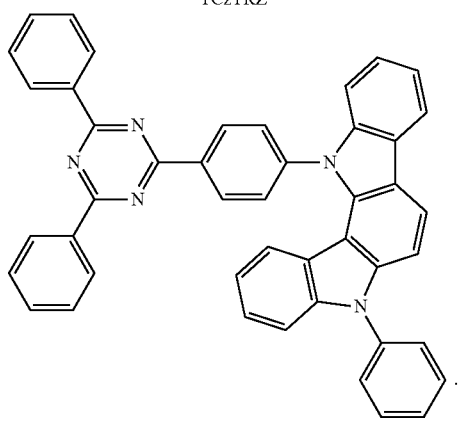

32a1CTRZ

10. The organic light emitting display device according to claim 9, further comprising a second emitting material layer positioned between the first emitting material layer and the first electrode and including a second host and a delayed fluorescent dopant, wherein the delayed fluorescent dopant in the second emitting material layer is selected from the group consisting of the compounds 4CzIPN, 4CzPN, Px-VPN, TCzTRZ and 32a1CTRZ.

11. The organic light emitting display device according to claim 10, further comprising a third emitting material layer positioned between the second emitting material layer and the first electrode and including a third host and a second fluorescent dopant, wherein the second fluorescent dopant is selected from the group consisting of the compounds 1-6 to 1-8, 1-22 to 1-25, 2-6 to 2-8, and 2-22 to 2-25.

* * * * *